(12) United States Patent
Yamamoto et al.

(10) Patent No.: US 11,637,220 B1
(45) Date of Patent: *Apr. 25, 2023

(54) SEMICONDUCTOR LIGHT-EMITTING ELEMENT

(71) Applicant: DOWA Electronics Materials Co., Ltd., Tokyo (JP)

(72) Inventors: Jumpei Yamamoto, Akita (JP); Tetsuya Ikuta, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/045,831

(22) Filed: Oct. 12, 2022

Related U.S. Application Data

(63) Continuation of application No. 17/047,690, filed as application No. PCT/JP2019/016713 on Apr. 18, 2019, now Pat. No. 11,515,448.

(30) Foreign Application Priority Data

Apr. 19, 2018  (JP) .................................. 2018-080899
Apr. 18, 2019  (JP) .................................. 2019-079334

(51) Int. Cl.
*H01L 33/22* (2010.01)
*H01L 33/30* (2010.01)
(Continued)

(52) U.S. Cl.
CPC .......... *H01L 33/30* (2013.01); *H01L 33/0062* (2013.01); *H01L 33/0093* (2020.05);
(Continued)

(58) Field of Classification Search
CPC ......... H01L 33/22; H01L 33/30; H01L 33/56; H01L 33/46; H01L 33/0093;
(Continued)

(56) References Cited

U.S. PATENT DOCUMENTS 7,691,656 B2   4/2010  Bader et al.
8,110,425 B2   2/2012  Yun
(Continued)

FOREIGN PATENT DOCUMENTS

JP   H06237042 A   8/1994
JP   H07147454 A   6/1995
(Continued)

OTHER PUBLICATIONS

Dec. 7, 2021, Office Action issued by the Korean Intellectual Property Office in the corresponding Korean Patent Application No. 10-2020-7029305.
(Continued)

*Primary Examiner* — Savitri Mulpuri
(74) *Attorney, Agent, or Firm* — Kenja IP Law PC

(57) ABSTRACT

A semiconductor light-emitting element comprises, in this order, a substrate, a reflective layer, a first conductivity type cladding layer made of InGaAsP containing at least In and P, a semiconductor light-emitting layer having an emission central wavelength of 1000 nm to 2200 nm and a second conductivity type cladding layer made of InGaAsP containing at least In and P, the second conductivity type cladding layer being configured to be on a light extraction side, a surface of a light extraction face of the second conductivity type cladding layer being a roughened surface which has a surface roughness Ra of 0.03 μm or more and has a random irregularity pattern. The surface of the light extraction face has a skewness Rsk of −1 or more, and a protective film is provided on the light extraction face.

10 Claims, 23 Drawing Sheets

(51) Int. Cl.
  *H01L 33/00* (2010.01)
  *H01L 33/46* (2010.01)
  *H01L 33/56* (2010.01)

(52) U.S. Cl.
  CPC .............. *H01L 33/22* (2013.01); *H01L 33/46* (2013.01); *H01L 33/56* (2013.01); *H01L 2933/0016* (2013.01); *H01L 2933/0025* (2013.01)

(58) Field of Classification Search
  CPC ................ H01L 33/0062; H01L 33/38; H01L 2933/0025; H01L 33/44; H01L 2933/0016; H01L 33/10
  See application file for complete search history.

(56) References Cited

U.S. PATENT DOCUMENTS

| | | |
|---|---|---|
| 8,318,519 B2 | 11/2012 | Doan et al. |
| 8,871,547 B2 | 10/2014 | Chu et al. |
| 10,199,541 B2 | 2/2019 | Huang et al. |
| 2014/0166975 A1 | 6/2014 | Ito |
| 2017/0012171 A1 | 1/2017 | Ko |
| 2019/0207055 A1 | 7/2019 | Yamamoto et al. |
| 2020/0020828 A1 | 1/2020 | Yamamoto et al. |
| 2020/0381589 A1 | 12/2020 | Yamamoto et al. |
| 2021/0020814 A1 | 1/2021 | Koshika et al. |

FOREIGN PATENT DOCUMENTS

| | | |
|---|---|---|
| JP | 2009032866 A | 2/2009 |
| JP | 2011216882 A | 10/2011 |
| JP | 2014120695 A | 6/2014 |
| JP | 2018006495 A | 1/2018 |
| KR | 1020160003845 A | 1/2016 |
| TW | 201724559 A | 7/2017 |
| TW | 201743462 A | 12/2017 |
| TW | 201802952 A | 1/2018 |

OTHER PUBLICATIONS

Feb. 6, 2020, Office Action issued by the Taiwan Intellectual Property Office in the corresponding Taiwanese Patent Application No. 108113898.

Jul. 16, 2019, International Search Report issued in the International Patent Application No. PCT/JP2019/016713.

Oct. 20, 2020, International Preliminary Report on Patentability issued in the International Patent Application No. PCT/JP2019/016713.

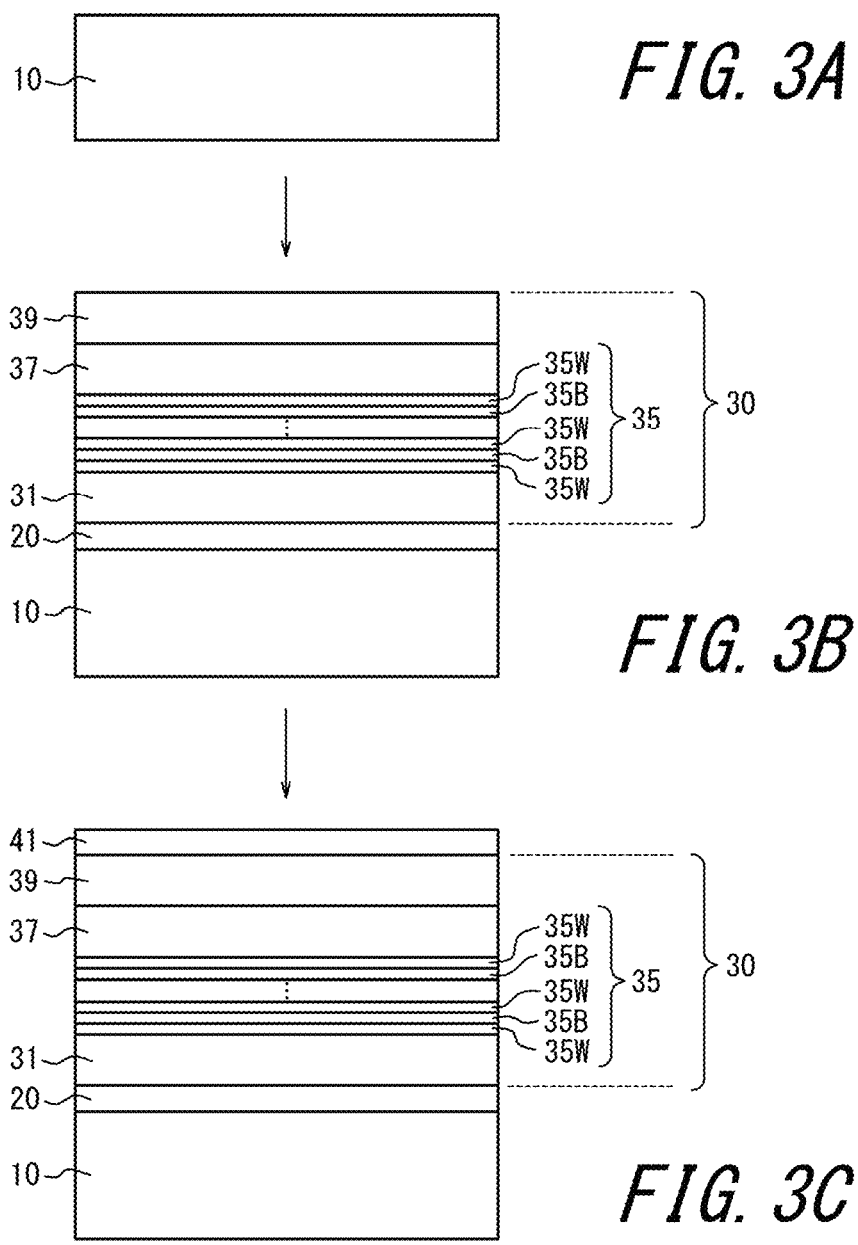

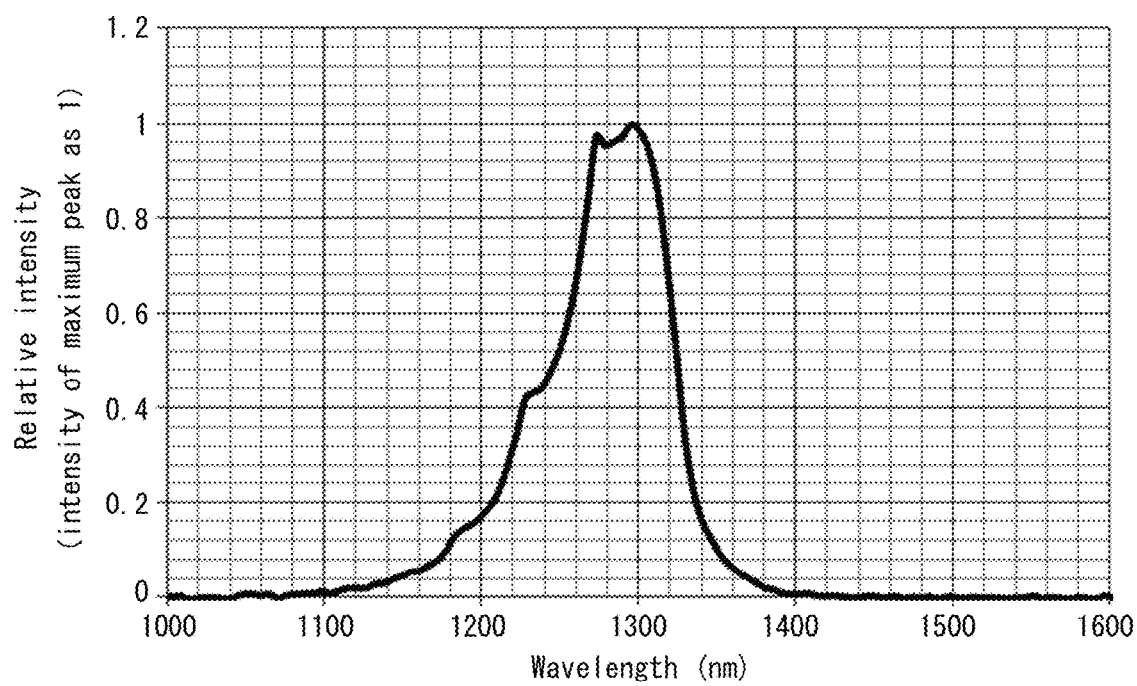

SEMICONDUCTOR LIGHT-EMITTING ELEMENT

CROSS-REFERENCE TO RELATED APPLICATIONS

The present application is a continuation application of U.S. patent application Ser. No. 17/047,690 filed Oct. 15, 2020, which is a National Stage Application of PCT/JP2019/016713 filed Apr. 18, 2019, which claims priority of Japanese Patent Application No. 2018-080899 filed Apr. 19, 2018, and Japanese Patent Application No. 2019-079334 filed Apr. 18, 2019. The disclosures of the prior applications are hereby incorporated by reference herein in their entirety.

TECHNICAL FIELD

The present disclosure relates to a semiconductor light-emitting element and a method of manufacturing the same, particularly to a semiconductor light-emitting element of infrared emissions.

BACKGROUND

Conventionally, semiconductor light-emitting elements are known which emit light with a wavelength of 750 nm or more in the infrared region. For example, infrared emission semiconductor light-emitting elements are widely used in the applications such as sensors, gas analysis, and surveillance cameras.

When emission wavelengths of such a semiconductor light-emitting element are 1000 nm to 2200 nm in a near infrared region, an InGaAsP-based III-V semiconductor containing In and P is usually used for a light-emitting layer. For epitaxially growing an InGaAsP-based III-V semiconductor layer such as an InP layer, an InP substrate is conventionally used as a growth substrate so that the InGaAsP-based III-V semiconductor layer containing In and P is lattice matched with the growth substrate.

For example, JP H07-147454 A (PTL 1) discloses a semiconductor laser emitting at wavelengths in the 1.3 μm range. This semiconductor laser has a strained multiple quantum well active layer formed on an n-InP substrate, and the strained multiple quantum well active layer has a structure in which InGaAsP strained quantum wells and InGaAsP barrier layers are alternately stacked.

Further, JP H06-237042 A (PTL 2) describes that InGaAsP barrier layers having the same lattice constant as an InP substrate, and quantum well layers including strained quantum well layers each formed from an $In_{0.3}Ga_{0.7}As$ layer having a smaller lattice constant than the InP substrate and lattice strain compensation layers each formed of InAs having a larger lattice constant than the InP substrate are provided on the InP substrate.

In the techniques described in PTL 1 and PTL 2, an InP substrate serving as a growth substrate is used as a support substrate for a semiconductor light-emitting element. This is because InP substrates are transparent to light in the near-infrared region and thus cause no obstruction to light extractions.

In a light-emitting element based on a III-V compound semiconductor containing In and P provided on an InP substrate, however, increasing the light emission output power is limited due to concentration of current paths directly under the electrode.

Recent diversified applications of LEDs have also created strong demands for higher output powers of semiconductor light-emitting elements emitting longer-wavelength light, such as infrared light. In light of such backgrounds, we have proposed in JP 2018-6495 A (PLT 3) a bonding-type semiconductor light-emitting element fabricated by forming a semiconductor stack having an InP-based cladding layer formed on a growth substrate, then bonding a support substrate and the growth substrate to each other, and removing the growth substrate.

CITATION LIST

Patent Literature

PLT 1: JP H07-147454 A
PLT 2: JP H06-237042 A
PLT 3: JP 2018-6495 A

SUMMARY

Technical Problem

We have confirmed that bonding-type semiconductor light-emitting devices disclosed in PTL 3 significantly improved the external extraction efficiency. These bonding-type semiconductor light-emitting elements, however, have a lot of light emission peaks other than the light emission peak at the emission central wavelength having the maximum emission intensity in an emission spectrum (hereinafter, such peaks are referred to as "multipeaks"). As used herein, the term "emission peak" (hereinafter simply referred to as "peak") refers to a point of a local maximum value in an emission spectrum where the gradient becomes zero, wherein the gradient is defined as the ratio of the change in values of the vertical axis (emission intensities) to the change in values of the horizontal axis (wavelengths). Peaks with relative intensities of less than 0.1 are excluded from multipeaks. Here, the term "relative intensity" of a peak is an emission intensity of that peak relative to the emission intensity of the emission peak at the emission central wavelength.

It is to be noted that a typical non-bonding type semiconductor light-emitting element of prior art has no peak other than the emission peak at the emission central wavelength in an emission spectrum (such a semiconductor light-emitting element only has the emission peak at the emission central wavelength, and such a peak is hereinafter referred to as "single peak" in this specification). Semiconductor light-emitting elements that emit multipeak radiation light as described above have emission peaks at various wavelengths having light emission intensities in terms of relative intensities of 0.1 or more relative to the emission intensity of the emission peak at the emission central wavelength. Thus, applications of such semiconductor light-emitting elements to sensors and other devices might cause problems.

Therefore, the present disclosure is directed to provide a bonding-type semiconductor light-emitting element including a cladding layer formed of InGaAsP containing at least In and P, which is capable of reducing multipeaks to thereby achieve a single peak in an emission spectrum and a manufacturing method of such a semiconductor light-emitting element.

Solution to Problem

We have made strenuously efforts to solve the aforementioned issues. The refractive index of InP to infrared light of about 3.2 when infrared light having a wavelength of 1000 nm to 2200 nm emitted from a light-emitting layer is incident on a cladding layer on the light extraction side made of InP. Thus, when light is attempted to be extracted from the cladding layer directly toward the air (which has a refractive index of 1), most of light obliquely incident on the interface is considered to be reflected back and enter the semiconductor layer. In contrast, in a semiconductor light-emitting element having a reflective layer between a light-emitting layer and a substrate, infrared light emitted toward a substrate from the light-emitting layer is reflected by the reflective layer, and the reflected light will pass through the light-emitting layer and be incident on the cladding layer on the light extraction side. Here, the total thickness of semiconductor layers in the semiconductor light-emitting element is about several micrometers to 15 µm, which is within the range of the coherent length of infrared light and is thus susceptible to interference. Note that the coherence length of light having a central emission wavelength of 1300 nm and a half band width of 100 nm is 16.9 µm, and the coherence length of light having an central emission wavelength 1460 nm and a half band width of 100 nm is 21.3 µm. We considered that observed multipeaks in an emission spectrum were induced by interference between reflected light at the interface of an InP cladding layer on the light extraction side as described above and light reflected by a reflective layer. This phenomenon also occurs when light is extracted from a cladding layer toward the air through a protective layer formed of a dielectric having a smaller refractive index than that of InP. From these findings, we have conceived of roughening the surface of a light extraction face of a cladding layer and have found that the surface roughening could eliminate multipeaks, thereby completing the present disclosure.

Specifically, we propose the following features.
(1) A semiconductor light-emitting element comprising, in this order:
a substrate;
a reflective layer;
a first conductivity type cladding layer made of InGaAsP containing at least In and P;
a semiconductor light-emitting layer having an emission central wavelength of 1000 nm to 2200 nm; and
a second conductivity type cladding layer made of InGaAsP containing at least In and P, the second conductivity type cladding layer being configured to be on a light extraction side,
a surface of a light extraction face of the second conductivity type cladding layer being a roughened surface which has a surface roughness Ra of 0.03 µm or more and has a random irregularity pattern.

(2) A semiconductor light-emitting element comprising, in this order:
a support substrate;
a metal bonding layer
a reflective layer;
a first conductivity type cladding layer made of InGaAsP containing at least In and P;
a semiconductor light-emitting layer having an emission central wavelength of 1000 nm to 2200 nm; and
a second conductivity type cladding layer made of InGaAsP containing at least In and P, the second conductivity type cladding layer being configured to be on a light extraction side,
a surface of a light extraction face of the second conductivity type cladding layer being a roughened surface which has a surface roughness Ra of 0.03 µm or more and has a random irregularity pattern.

(3) The semiconductor light-emitting element according to (1) or (2), wherein an emission spectrum of the semiconductor light-emitting element has a single peak.

(4) The semiconductor light-emitting element according to any one of (1) to (3), wherein the surface of the light extraction face has a skewness Rsk of −1 or more.

(5) The semiconductor light-emitting element according to any one of (1) to (3), further comprising a protective film provided on the light extraction face.

(6) The semiconductor light-emitting element according to (5), wherein the protective film has a thickness of 100 nm or more and 700 nm or less, and a surface of the protective film has a surface roughness Ra of 0.02 µm or more and a skewness Rsk of −1 or more.

(7) The semiconductor light-emitting element of (5) or (6), wherein the protective film contains at least one selected from the group consisting of silicon oxide, silicon nitride, ITO, and AlN.

(8) A method of manufacturing a semiconductor light-emitting element comprising:
forming, on a substrate in this order, a reflective layer, a first conductivity type cladding layer made of InGaAsP containing at least In and P, a semiconductor light-emitting layer having an emission central wavelength of 1000 nm to 2200 nm, and a second conductivity type cladding layer made of InGaAsP containing at least In and P, the second conductivity type cladding layer being configured to be on a light extraction side; and
a surface roughening step of, after forming the second conductivity type cladding layer, roughening a surface of a light extraction face of the second conductivity type cladding layer so as to have a surface roughness Ra of 0.03 µm or more and have a random irregularity pattern.

(9) The method of manufacturing a semiconductor light-emitting element according to (8), wherein the surface roughening step comprising roughening the surface of the light extraction face so as to have a skewness Rsk of −1 or more

(10) A method of manufacturing a semiconductor light-emitting element, comprising:
a semiconductor layer formation step of forming, on a growth substrate in this order, a group III-V compound semiconductor etch stop layer containing In, Ga, and As, a second conductivity type cladding layer made of InGaAsP containing at least In and P, a semiconductor light-emitting layer having an emission central wavelength of 1000 nm to 2200 nm, and a first conductivity type cladding layer made of InGaAsP containing at least In and P;
a reflective layer formation step of forming a reflective layer for reflecting light emitted from the semiconductor light-emitting layer on the first conductivity type cladding layer;
a bonding step of bonding a support substrate to the reflective layer, having a metal bonding layer interposed therebetween;
a substrate removal step of removing the growth substrate; and
a surface roughening step of, after the substrate removal step, roughening a surface of a light extraction face of the second conductivity type cladding layer so as to have a surface roughness Ra of 0.03 µm or more and have a random irregularity pattern.

(11) The method of manufacturing a semiconductor light-emitting element according to (10), wherein the surface roughening step comprising roughening the surface of the light extraction face so as to have a skewness Rsk of −1 or more.

(12) The method of manufacturing a semiconductor light-emitting element according to (10) or (11), further comprising a top electrode formation step of forming an electrode in a second conductivity type on the second conductivity type cladding layer in a top electrode formation region of the second conductivity type cladding layer, having the etch stop layer interposed therebetween.

Advantageous Effect

According to the present disclosure, provided are a bonding-type semiconductor light-emitting element including a cladding layer made of InGaAsP containing at least In and P, which is capable of reducing multipeaks to thereby achieve a single peak in an emission spectrum and a manufacturing method of such a semiconductor light-emitting element.

BRIEF DESCRIPTION OF THE DRAWINGS

In the accompanying drawings:

FIGS. 3A to 3C are schematic cross-sectional views in manufacturing steps of a semiconductor light-emitting element according to an embodiment of the present disclosure;

FIG. 18C is a graph indicating an emission spectrum of Comparative Example 3;

DETAILED DESCRIPTION

Figure 1:
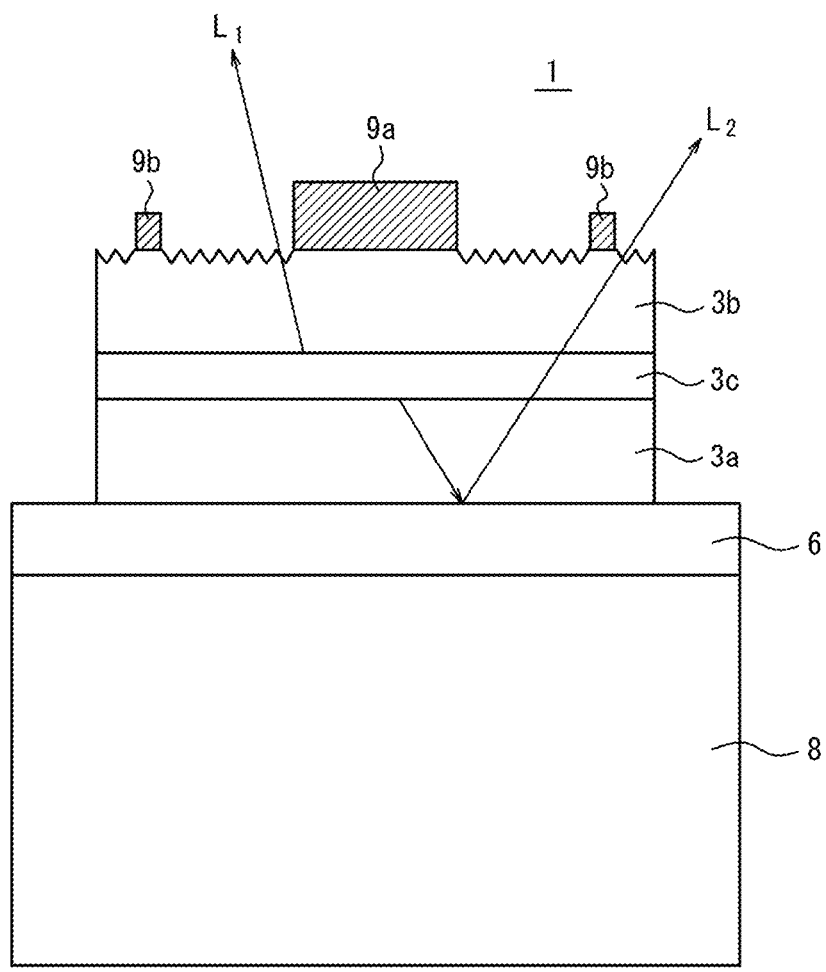
FIG. 1 is a schematic cross-sectional view illustrating a semiconductor light-emitting element according to an embodiment of the present disclosure.

Prior to describing embodiments of this disclosure, the following is described beforehand. First, in this specification, the expression "InGaAsP" alone for which the composition ratio is not specified means a given compound having a chemical composition ratio of group III elements (In and Ga in total) with respect to group V elements (As and P) of 1:1, in which the ratio between In and Ga that are group III elements and the ratio between As and P that are group V elements are undefined. In this case, there may be a possibility that one of In and Ga is not contained as the group III elements; or there may be a possibility that one of As and P is not contained as the group V elements. However, InGaAsP specified as "containing at least In and P" means that more than 0% and 100% or less of In is contained in the group III elements, and more than 0% and 100% or less of P is contained in the group V elements. Further, the expression "InGaP" means that As is not contained in the above-mentioned "InGaAsP" except for inevitable contamination in production, and the expression "InGaAs" means that P is not contained in the above-mentioned "InGaAsP" except for inevitable contamination in production. Similarly, the expression "InAsP" means that Ga is not contained in the above-mentioned "InGaAsP" except for inevitable contamination in production, and the expression "GaAsP" means that In is not contained in the above-mentioned "InGaAsP" except for inevitable contamination in production. Further, the expression "InP" means that Ga and As are not contained in the above-mentioned "InGaAsP" except for inevitable contamination in production. Note that the values of the composition ratios of InGaAsP, InGaAs, and the like can be measured for example by a photoluminescence measurement or an X-ray diffraction measurement. Further, as used herein, the term "inevitable contamination in production" refers to inevitable contamination originated from a manufacturing apparatus where source gases are used, as well as diffusions of atoms at interfaces between layers upon crystal growth or a subsequent heat treatment, and the like.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Zn, S, Sn, C, P, Ga, As, Si, and Al and does not serve as an electrically p-type or n-type layer is referred to as an "i-type" or "undoped" layer. An undoped InGaAsP layer may contain impurities that are inevitably mixed in the production process. Specifically, when the carrier density is low (for example, less than $4\times10^{16}/cm^3$), the layer is regarded as being "undoped" in this specification. Further, the values of the impurity concentrations of Zn, Sn, etc. are determined by SIMS analysis.

The total thickness of the layers formed can be measured using a thickness measurement system using optical interferometry. Moreover, the thickness of each layer can be calculated by observing a cross section of the growth layer using a thickness measurement system using optical interferometry and a transmission electron microscope. When the thickness of each layer is small as in a superlattice structure, the thickness can be measured using TEM-EDS. Note that when a certain layer has an inclined surface in a cross-sectional view, the thickness of the layer is defined by the maximum height of the layer from a flat surface of the underlying layer.

As used herein, the term "surface roughness Ra" of a surface refers to the arithmetic average roughness (μm) of that surface at a measurement distance. Further, the term "skewness Rsk" is a value indicating the symmetry between peaks and valleys relative to the average line. A surface having a value of Rsk of zero is vertically symmetric to the average line (has a normal distribution). A surface having a positive value of Rsk deviates downward (to the valley side) relative to the average line. A surface having a negative value of Rsk deviates upward (to the mountain side) relative to the average line. The definitions of a surface roughness Ra and a skewness Rsk are stipulated in ISO 4287-1997. Further, as used herein, similarly to a surface roughness Ra, the term "surface roughness Sa" of a surface is a value indicating the arithmetic average roughness (μm), and stipulated in ISO 25178. Even further, similarly to a skewness Rsk, the term "skewness Ssk" is a value indicating the symmetry between peaks and valleys relative to the average line, and is defined in ISO 25178. A surface roughness Ra and a skewness Rsk are values determined by the two-dimensional contour mapping technique according to ISO 4287-1997, whereas a surface roughness Sa and a skewness Ssk are values determined from three-dimensional surface characteristics in accordance with ISO 25178.

A surface roughness Ra and a skewness Rsk can be measured using a stylus surface profile analyzer (e.g., contact-type surface profile analyzer P-6 manufactured by KLA Tencor Corp.). A stylus used may have a stylus tip radius of 2 μm, and measurement conditions may be as follows: a stylus contact pressure of 2 mg, a scan speed of 2 μm/sec, and a sampling frequency of 50 Hz. The measurement distance (reference length) may be set to 200 μm. A surface roughness Sa and a skewness Ssk can be measured using a non-contact type laser scanning microscope (VK-X1000/1100 manufactured by KEYENCE Corporation). The measurement conditions in an example (Experimental Example 2) in this specification were as follows: the lens magnification was set to 150 times and the pixel number was set to 2048×1536.

Further, as used herein, the term "random roughened surface" refers to a surface on the light-extraction side, except for ones in which a profile with periodical grooves are observable and the surface roughness Ra of a region without grooves is 0.010 μm or less, in a result analyzed by a contact-type surface profile analyzer as described above. An example surface profile having a surface roughness Ra of a region without grooves of 0.010 μm or less is a surface profile of a surface prepared by forming a mask having periodic openings on the surface on the light extraction side, followed by etching the surface to form grooves. When a light-emitting element has such a surface on the light extraction side, reflection angles of light reflected by that surface may be sufficiently dispersed, which may render the effect of the present disclosure of providing a single peak sufficient.

(Semiconductor Light-Emitting Element 1)

Referring to FIG. 1, a semiconductor light-emitting element 1 according to an embodiment of the present disclosure is a semiconductor light-emitting element including a first conductivity type cladding layer 3a, a semiconductor light-emitting layer 3c, and a second conductivity type cladding layer 3b, provided sequentially on a substrate 8, in which the second conductivity type cladding layer 3b is configured to be on the light extraction side. The semiconductor light-emitting element 1 further includes a reflective layer 6 between the support substrate 8 and the first conductivity type cladding layer 3a, for reflecting light emitted from the semiconductor light-emitting layer 3c.

The first conductivity type cladding layer 3a and the second conductivity type cladding layer 3b are made of InGaAsP containing at least In and P, and are most preferably formed of InP. Further, the semiconductor light-emitting layer 3c is preferably a light-emitting layer that emits light having an emission central wavelength of 1000 nm to 2200 nm, and is made of InGaAsP containing at least In and P. Further, the surface of the light extraction face of the second conductivity type cladding layer is a roughened surface which has a surface roughness Ra of 0.03 μm or more and has a random irregularity pattern. Note that, in the semiconductor light-emitting element 1, a top electrode including a pad portion 9a and a wiring portion 9b may be formed on the second conductivity type cladding layer 3b, and a back electrode may be formed on the back surface of the conductive support substrate (no back electrode is illustrated).

In the semiconductor light-emitting element 1, light emitted from the semiconductor light-emitting layer 3c is roughly divided into light $L_1$ traveling toward the second conductivity type cladding layer 3b, and light $L_2$ traveling toward the first conductivity type cladding layer 3a. In the present embodiment, the region on the surface of the second conductivity type cladding layer 3b other than the top electrodes 9a and 9b, from which the light $L_1$ and $L_2$ is emitted to the outside (primarily to the air), is referred to as the "light extraction face". In other words, as illustrated in FIG. 1, the "light extraction face" in the present embodiment refers to the surface from which light is emitted to the outside, which is the same surface (upper surface) as the surface on which the top electrodes are formed. Note that light is also extracted from side surfaces of the semiconductor light-emitting element 1. Light extraction from the side surfaces, however, substantially does not affect on generation of multipeaks, and thus the side surfaces may or may not be roughened. For improving the emission power output, the side surfaces are also preferably roughened.

In the semiconductor light-emitting element 1, the "light extraction face" of the second conductivity type cladding layer 3b is a roughened surface. The surface of the light extraction face has a surface roughness Ra of 0.03 µm or more. The surface of the light extraction face more preferably has a skewness Rsk of −1 or more. More preferably, the following are satisfied: Ra ≥0.04 µm and Rsk ≥−0.5. The top electrodes 9a and 9b are provided on the flat portion of the surface of the second conductivity type cladding layer 3b.

Our experiments have found that a surface of a light extraction face having a roughened surface provided with an irregularity pattern which was not random but periodic could not reduce multipeaks to provide a single peak. More specifically, it was found that even a surface with a skewness Rsk of a positive value could not achieve a single peak when irregularities were shallow with a surface roughness Ra of smaller than 0.03 µm. Thus, the surface roughness Ra is preferably 0.03 µm or more, and more preferably 0.04 µm or more for achieving a single peak. It was also found that a surface having a surface roughness Ra of 0.03 µm or more could not reduce multipeaks to thereby provide a single peak when the value of the skewness Rsk is negative smaller than −1 (i.e., Rsk <−1) and a large number of flat surfaces or near flat portions were formed at apexes on the light extraction side. Accordingly, the skewness Rsk is preferably −1 to 0 or a positive value (i.e., Rsk ≥−1). The skewness Rsk is more preferably −0.05 to 0.5 (i.e., −0.5 Rsk 0.5).

Further, our experiments have also found that the profile of a roughened surface suitable to improve the output power of a light-emitting element did not necessarily match the profile of a roughened surface suitable to reduce multipeaks. The profile of a roughened surface suitable to reduce multipeaks has a surface roughness Ra of 0.03 µm or more and a skewness Rsk of −1.0 or more. The profile of a roughened surface that is suitable to reduce multipeaks and is the most effective for improving the light emission output has a surface roughness Ra of 0.04 µm or more and a skewness Rsk of −0.5 or more and 0.5 or less. The upper limit of the surface roughness Ra is at least less than the thickness of the second conductivity type cladding layer which is subjected to roughening, and is 4 µm, for example. The upper limit of the skewness Rsk of a surface suitable to reduce multipeaks is not particularly limited, and is 2, for example. For the same reason as described above, the surface roughness Sa of the surface of the light extraction face is preferably 0.05 µm or more. Further, the skewness Ssk of the surface of the light extraction face is preferably −0.5 or more.

In the case where the conductivity type of the first conductivity type cladding layer 3a is n-type, the second conductivity type cladding layer 3b is p-type. On the contrary, in the case where the conductivity type of the first conductivity type cladding layer 3a is p-type, the second conductivity type cladding layer 3b is n-type.

Although not illustrated, it is also a preferable to leave an etch stop layer between the second conductivity type cladding layer 3b and the top electrode including the pad portion 9a and the wiring portion 9b.

Figure 2:
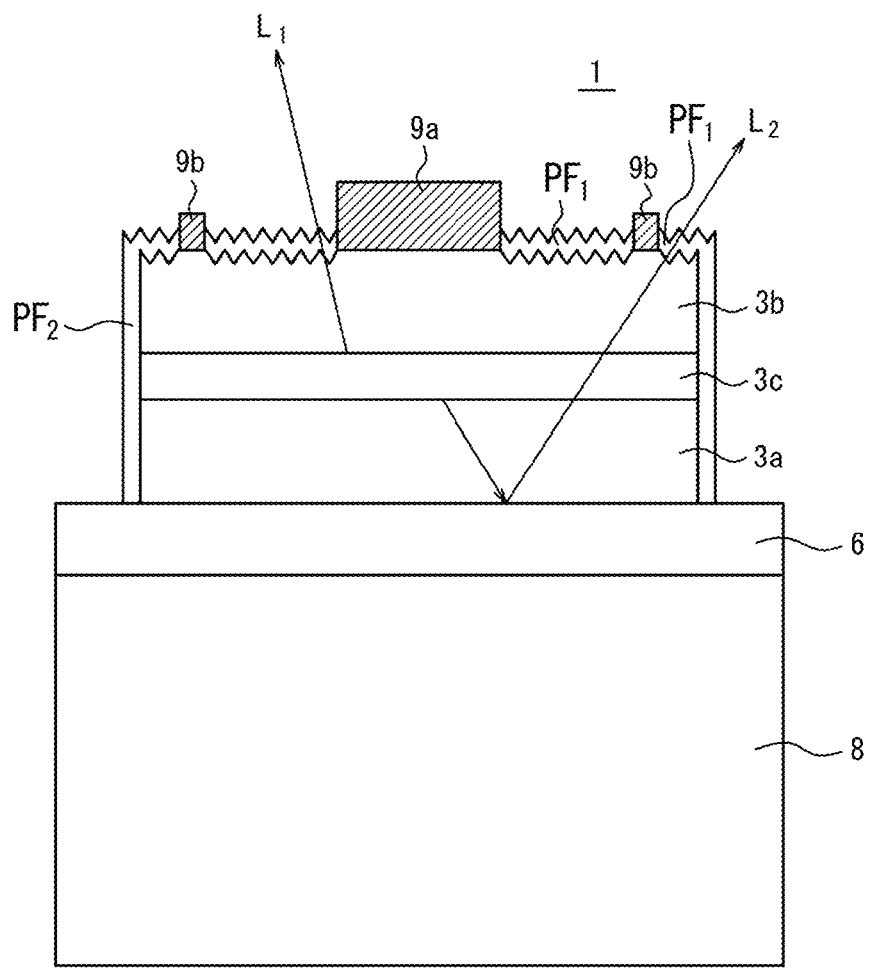
FIG. 2 is a schematic cross-sectional view illustrating a semiconductor light-emitting element according to a preferred embodiment of the present disclosure.

Further, as illustrated in FIG. 2, it is preferable that the semiconductor light-emitting element 1 further includes a protective film $PF_1$ on the second conductivity type cladding layer 3b, except for regions above the top electrodes (the pad portion 9a and the wiring portion 9b). The protective film $PF_1$ may use $SiO_2$, SiN, ITO, AlN, etc., and the protective film $PF_1$ is preferably formed of $SiO_2$ in particular. The protective film $PF_1$ is effective for enhancing light extraction by mitigating the refractive index difference between the second conductivity type cladding layer 3b and the air.

Further, although the reason is unknown, it was found that provision of a protective film on a "random roughened surface" according to the present disclosure was greatly effective for reducing a reduction in the output power caused by a continuous operation. For example, the initial light emission output power relative to the light emission output power after a 1000-hour continuous operation of 100 mA (hereinafter, this ratio is referred to as the "light emission output power retention ratio") was 94% for a semiconductor light-emitting element provided with a "random roughened surface". In contrast, provision of a protective film to the semiconductor light-emitting element had improved the light emission output power retention ratio to 99 to 100% (see Experimental Example 3 described later). In semiconductor light-emitting elements which had no roughened surface or which had a roughened surface which did not satisfy the conditions of the present disclosure, the light emission output power retention ratio remained 94%. When a protective film was formed to these semiconductor light-emitting elements, the light emission output power retention ratio had improved but remained about 97%.

The thickness of the protective film $PF_1$ is preferably 100 nm or more, more preferably 215 nm or more. Further, the thickness of the protective film $PF_1$ is preferably 700 nm or less, more preferably 650 nm or less. When the thickness of $PF_1$ is within one of these ranges, extraction of light in a wavelength range of 1000 nm to 2200 nm is improved.

The protective film $PF_1$ is formed so that the protective film $PF_1$ substantially conforms to irregularities on the surface of the underlying layer, i.e., the second conductivity type cladding layer 3b. When a protective film $PF_1$ is deposited on a surface using a thin film deposition apparatus by plasma CVD, for example, coating with the protective film $PF_1$ slightly smooths the irregularities on the second conductivity type cladding layer 3b as compared with the second conductivity type cladding layer 3b without the coating. As a result, the surface roughness Ra is reduced in a surface profile analysis of the surface including the protective film $PF_1$. Accordingly, it is preferable that the surface including the protective film has a surface roughness Ra of 0.02 µm or more (i.e., Ra ≥0.02 µm) and a skewness Rsk of −1 or more (i.e., Rsk ≥−1).

As illustrated in FIG. 2, a protective film $PF_2$ may also be provided for protecting the side surfaces of the first conductivity type cladding layer 3a, the semiconductor light-emitting layer 3c, and the second conductivity type cladding layer 3b. The material of the protective film $PF_2$ may be the same as or different from the material of the protective film $PF_1$.

Further, in place of the substrate 1 of the semiconductor light-emitting element 1 illustrated in FIGS. 1 and 2, a bonding-type semiconductor light-emitting element may be used in which a metal bonding layer may be provided on a surface of a support substrate so that the metal bonding layer is bonded to a reflective layer.

Hereinafter, elements in the semiconductor light-emitting element 1 according to the present disclosure will be described by providing descriptions to each step of manufacturing a bonding-type semiconductor light-emitting element 100 according to a preferred embodiment of the present disclosure. Note that elements in the semiconductor light-emitting element 1 and elements in the semiconductor light-emitting element 100 correspond to each other as follows. Specifically, the first conductivity type cladding layer 3a corresponds to a p-type cladding layer 37, the semiconductor light-emitting layer 3c corresponds to a semiconductor light-emitting layer 35, the second conductivity type cladding layer 3b corresponds to an n-type cladding layer 31, the reflective layer 6 corresponds to a reflective layer 60, and the support substrate 8 corresponds to the support substrate 80.

(Method of Manufacturing Semiconductor Light-Emitting Element 100)

A method of manufacturing the semiconductor light-emitting element 100 according to an embodiment of the present disclosure preferably includes a semiconductor layer formation step, a contact layer step, a dielectric layer formation step, a reflective layer formation step, a bonding step, a substrate removal step, and a surface roughening step, which will be described in detail in the following.

Initially, in the semiconductor layer formation step, a III-V compound semiconductor etch stop layer 20 is formed on a growth substrate 10, and a n-type cladding layer 31, a semiconductor light-emitting layer 35, and an p-type cladding layer 37 are then formed sequentially to form a semiconductor stack 30 (FIGS. 3A and 3B).

Figure 4A:
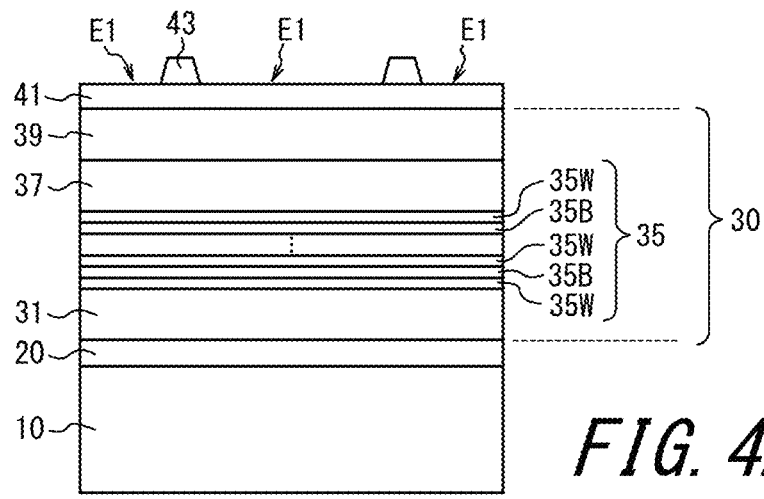
FIGS. 4A to 4C are schematic cross-sectional views in the manufacturing steps subsequent to FIGS. 3A to 3C of the semiconductor light-emitting element according to an embodiment of the present disclosure.
Figure 4B:
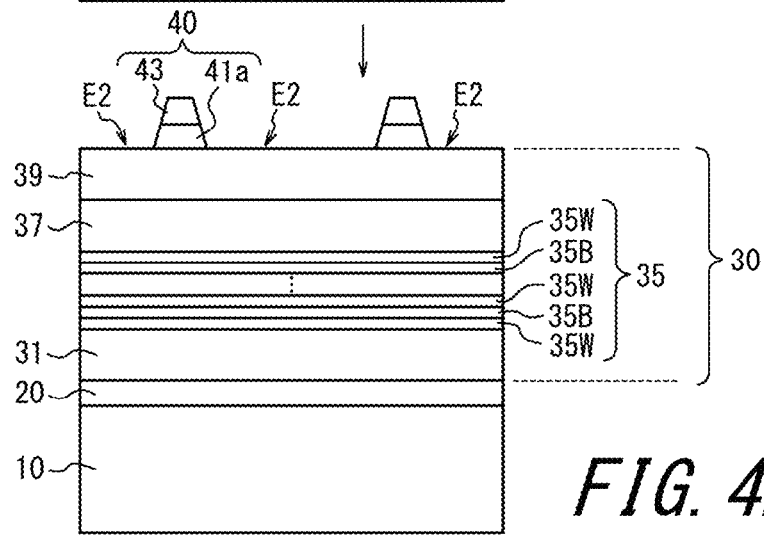

In the contact portion formation step, initially, a contact layer 41 made of a III-V compound semiconductor is formed on the semiconductor stack 30 (FIG. 3C). Subsequently, ohmic metal portions 43 are formed on parts of the contact layer 41 leaving the exposed area E1 on a surface of the contact layer 41 (FIG. 4A). Subsequently, the contact layer 41 of the exposed area E1 is removed so that a surface of the semiconductor stack 30 is exposed, thereby forming a contact portion 40 composed of the ohmic metal portion 43 and the contact layer 41a and providing an exposed surface E2 of the semiconductor stack 30 (FIG. 4B).

Figure 4C:
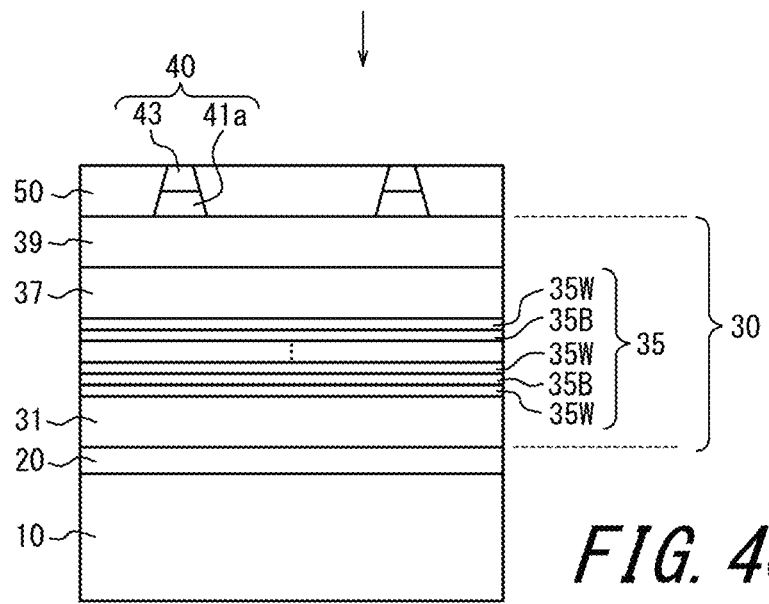
Figure 5A:
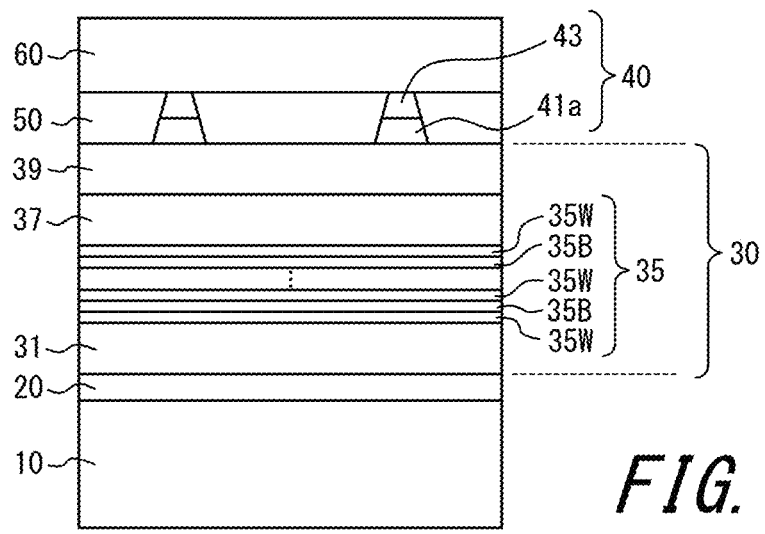
FIGS. 5A and 5B are schematic cross-sectional views in the manufacturing steps subsequent to FIGS. 4A to 4C of the semiconductor light-emitting element according to an embodiment of the present disclosure.
Figure 5B:
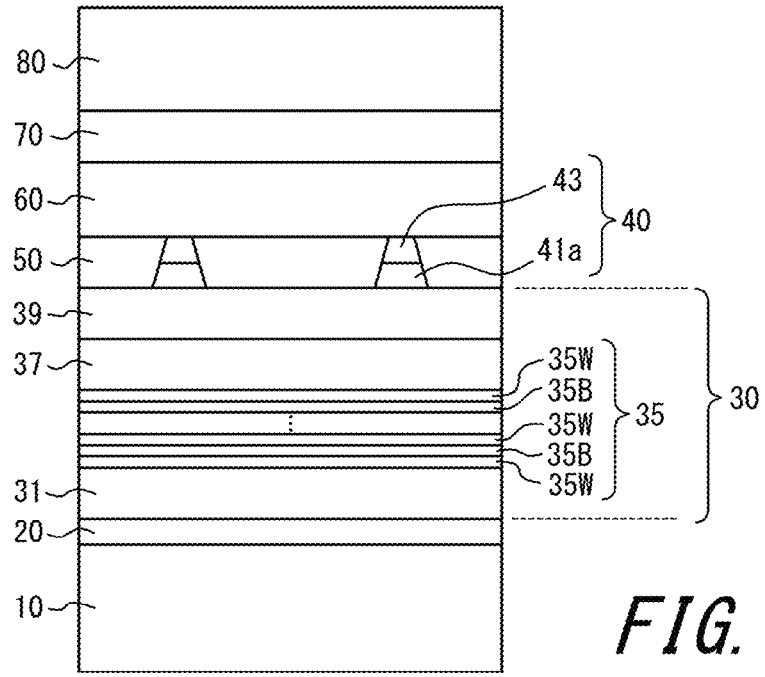
Figure 6A:
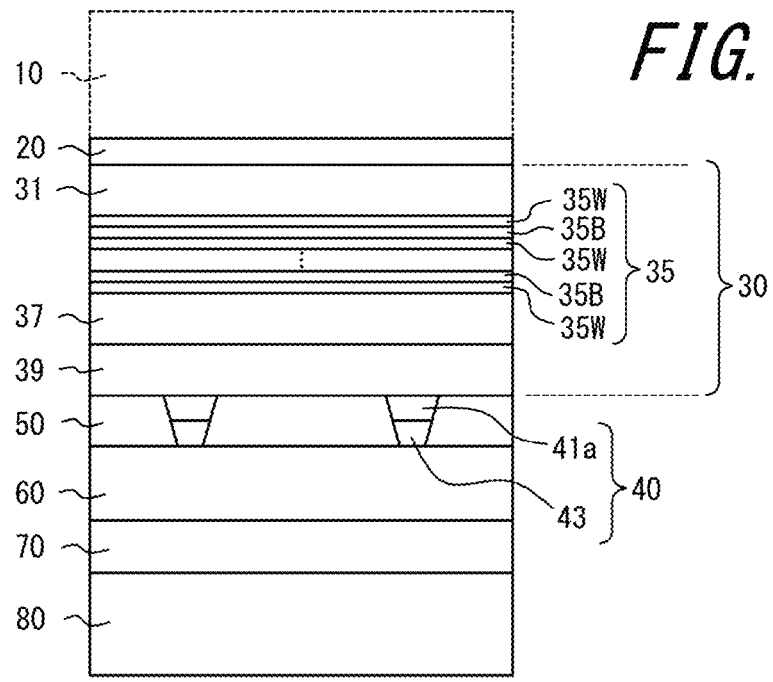
FIGS. 6A and 6B are schematic cross-sectional views in the manufacturing steps subsequent to FIGS. 5A and 5B of the semiconductor light-emitting element according to an embodiment of the present disclosure.

In the dielectric layer formation step, a dielectric layer 50 is formed on at least part of the exposed surface E2 of the semiconductor stack 30 (FIG. 4C). In the reflective layer formation step, a reflective layer 60 for reflecting light emitted from the semiconductor light-emitting layer 35 is formed on the dielectric layer 50 and the contact portion 40 (FIG. 5A). In the bonding step, a support substrate 80 having a surface provided with a metal bonding layer 70 is bonded to the reflective layer 60 having the metal bonding layer 70 interposed therebetween (FIG. 5B). Then, in the substrate removal step, the growth substrate 10 is removed (FIG. 6A).

Figure 6B:
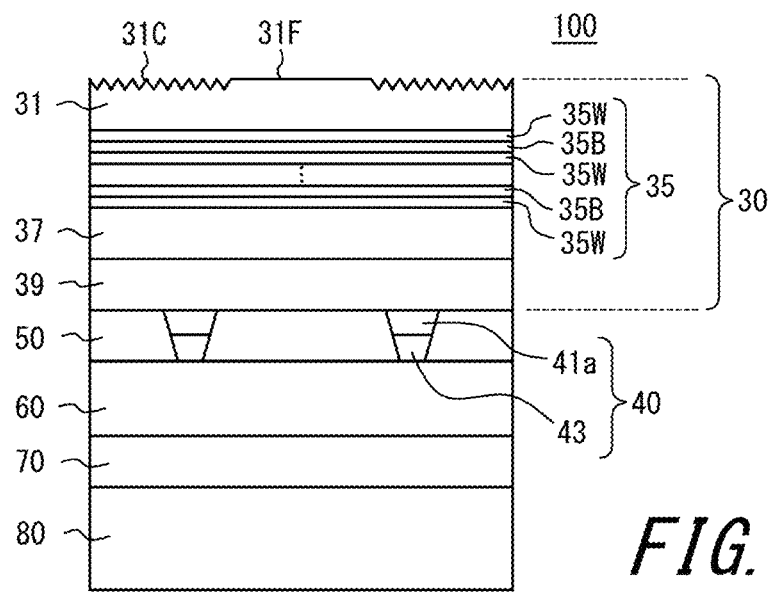
Figure 7:
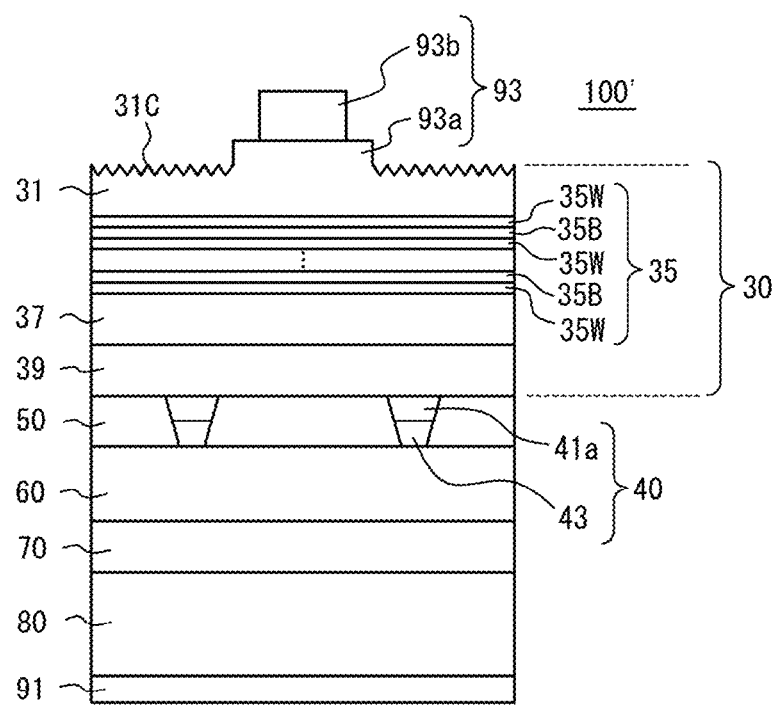
FIG. 7 is a schematic cross-sectional view of a semiconductor light-emitting element manufactured according to an embodiment of the present disclosure.

After the region to form a top electrode is masked, the surface roughening step of forming a plurality of irregularities 31C on the surface of the p-type cladding layer 31 is carried out (FIG. 6B). Thereafter, a step of forming a top electrode on the second conductivity type cladding layer is carried out. In this manner, the semiconductor light-emitting element 100 according to a preferred embodiment of the present disclosure can be manufactured. Note that the top electrode may be formed before the surface roughening step. In this manner, the semiconductor light-emitting device 100 according to a preferred embodiment of the present disclosure can be manufactured (FIG. 7). These steps will be sequentially described in detail below.

<Semiconductor Layer Formation Step>

In the semiconductor layer formation step, the III-V compound semiconductor etch stop layer 20 is formed on the growth substrate 10, and the n-type cladding layer 31, the semiconductor light-emitting layer 35, and the p-type cladding layer 37 are then formed sequentially to form the semiconductor stack 30 (FIGS. 3A and 3B).

In the semiconductor layer formation step, as depicted in FIG. 3A, initially, the growth substrate 10 is provided. Since the p-type cladding layer 37 and the n-type cladding layer 31 are to be formed in this embodiment, an InP substrate is preferably used as the growth substrate 10. Note that the InP growth substrate may use any of n-type InP substrates, high-resistivity (also referred to as semi-insulating) InP substrates (for example, Fe-doped InP substrates having a resistivity of $1 \times 10^6 \Omega \cdot cm$ or more), and p-type InP substrates, which are commercially available. For convenience of description, a preferred embodiment in which an n-type InP substrate is used as the growth substrate 10 will be described.

Next, on the growth substrate 10, the III-V compound semiconductor etch stop layer 20 is formed. As described above, any materials having etching selectivity to the growth substrate 10 may be used for the III-V compound semiconductor etch stop layer 20, and InGaAs may be used for the etch stop layer for an InP substrate, or InGaAsP may also be used for the etch stop layer, for example. The III-V compound semiconductor etch stop layer 20 can be used when the growth substrate 10 is removed by etching in the substrate removal step. In the case where an n-type InP substrate is used as the growth substrate 10, the conductivity type of the III-V compound semiconductor etch stop layer 20 is preferably n-type so that the conductivity type of the III-V compound semiconductor etch stop layer 20 matches the conductivity type of the growth substrate. In the case where InGaAs is used for the III-V compound semiconductor etch stop layer 20, the content of In as a group III element in InGaAs is preferably 0.3 to 0.7, more preferably 0.5 to 0.6, such that InGaAs can be lattice matched with the n-type InP substrate.

Subsequently, the n-type cladding layer 31, the semiconductor light-emitting layer 35, and the p-type cladding layer 37 are formed sequentially on the III-V compound semiconductor etch stop layer 20, to form the semiconductor stack 30. Since the semiconductor light-emitting layer 35 is sandwiched between the p-type cladding layer 37 and the n-type cladding layer 31, the semiconductor light-emitting layer 35 is preferably a layer made of an InGaAsP-based III-V compound semiconductor containing at least In and P. The semiconductor laminate 30 may have a double hetero (DH) structure in which the semiconductor light-emitting layer 35 is sandwiched between the p-type cladding layer 37 and the n-type cladding layer 31 or may have a multiple quantum well (MQW) structure. With a view to improving the light output power by reducing crystal defects, the semiconductor light-emitting layer 35 more preferably has a multiple quantum well structure. A multiple quantum well structure can be formed by alternately repeatedly providing well layers 35W and barrier layers 35B. The well layers 35W may be of InGaAsP, and the barrier layers 35B are preferably of InGaAsP or InP having a larger band gap than the well layers 35W. A provision of such a semiconductor stack 30 as described above allows the semiconductor light-emitting element 100 to emit light having a wavelength in a desired near-infrared region. For example, an emission peak wavelength of 1000 nm to 1650 nm can be achieved by varying the composition of the InGaAsP-based III-V compound. In the case of a MQW structure, an emission peak wavelength of 1000 nm to 1900 nm can be achieved by in addition to varying the composition of the InGaAsP-based III-V compound, applying strain to the well layers by controlling the composition difference between the well layers and the barrier layers. Or, an emission peak wavelength of 1000 nm to 2200 nm can be achieved by applying a further strain. Further, when the chemical composition of the well layers 35W is expressed as $I_{xw}Ga_{1-xw}As_{yw}P_{1-yw}$, $0.5 \leq xw \leq 1$ and $0.5 \leq yw \leq 1$ can be satisfied, and $0.6 \leq xw \leq 0.8$ and $0.3 \leq yw \leq 1$ are preferably satisfied.

The total thickness of the semiconductor laminate 30 may be for example, but not limited to, 2 μm to 15 μm. Similarly, the thickness of the p-type cladding layer 31 may be for example, but not limited to, 1 μm to 5 μm. Further, the thickness of the semiconductor light-emitting layer 35 may be for example, but not limited to, 100 nm to 1000 nm. Similarly, the thickness of the n-type cladding layer 31 may be for example, but not limited to, 0.8 μm to 10 μm. When the semiconductor light-emitting layer 35 has a quantum well structure, the thickness of the well layers 35W may be 3 nm to 15 nm, and the thickness of the barrier layers 35B may be 5 nm to 15 nm. The number of pairs of both layers may be 3 to 50.

Further, the semiconductor laminate 30 preferably has a p-type cap layer 39 formed of InGaAsP containing at least In and P on the p-type cladding layer 37. The lattice mismatch can be reduced by providing the p-type cap layer 39. The thickness of the cap layer 39 may be for example, but not limited to, 50 nm to 200 nm. In the following embodiment, for convenience of description, description is made assuming that the outermost surface layer of the semiconductor laminate 30 is the p-type cap layer 39; however, since the p-type cap layer 39 is an optional component, the outermost surface layer of the semiconductor laminate 30 may be for example, the p-type cladding layer 37.

Although not illustrated, the semiconductor stack 30 preferably has an i-type InP spacer layer each between the n-type cladding layer 31 and the semiconductor light-emitting layers 35 and between the semiconductor light-emitting layers 35 and the p-type cladding layer 37. The provision of the i-type InP spacer layers can hinder dopant diffusion. The thickness of the i-type InP spacer layers may be for example, but not limited to, 50 nm to 400 nm. The semiconductor stack 30 may further have an n-type InGaAsP layer having a composition ratio different from that of the III-V compound semiconductor etch stop layer 20, between the n-type cladding layer 31 and the III-V compound semiconductor etch stop layer 20.

Here, the layers in the semiconductor laminate 30 can be formed by epitaxial growth, for example by a known thin film deposition technique such as metalorganic chemical vapor deposition (MOCVD), molecular beam epitaxy (MBE), or sputtering. For example, trimethylindium (TMIn) may be used as an In source, trimethylgallium (TMGa) as a Ga source, arsine ($AsH_3$) as an As source, and phosphine ($PH_3$) as a P source at a predetermined mixing ratio, and these source gases may be subjected to vapor phase epitaxy using a carrier gas to form an InGaAsP layer having a desired thickness by controlling the growth time. Note that other InGaAsP layers, such as the III-V compound semiconductor etch stop layer 20, to be epitaxially grown may be formed in a similar manner. When the layers are p-type or n-type doped, a dopant source gas can be used in addition as desired.

<Contact Portion Formation Step>

In the contact portion formation step, initially, the contact layer 41 made of a III-V compound semiconductor is formed on the semiconductor stack 30 (FIG. 3C). For example, as illustrated in FIG. 3C, the p-type contact layer 41 can be formed on the p-type cap layer 39. The p-type contact layer 41 may be a layer which is in contact with the ohmic metal portion 43, is interposed between the ohmic metal portion 43 and the semiconductor laminate 30, and has a composition allowing for lower contact resistance with the ohmic metal portion 43 than with the semiconductor laminate 30. For example, the p-type contact layer 41 can be a p-type InGaAs layer. The thickness of the contact layer 41 may be for example, but not limited to, 50 nm to 200 nm.

Subsequently, the ohmic metal portion 43 is formed on a part of the contact layer 41 leaving the exposed area E1 on a surface of the contact layer 41 (FIG. 4A). The ohmic metal portion 43 can be formed into islands distributed in a predetermined pattern. When a p-type InGaAs layer is used as the p-type contact layer 41, for example, Au, AuZn, AuBe, AuTi, etc. can be used as the ohmic metal portion 43, and a structure in which those materials are stacked can preferably be used as the ohmic metal portion 43. For example, Au/AuZn/Au may be used as the ohmic metal portion 43. The thickness (or the total thickness) of the ohmic meal portion 43 may be for example, but not limited to 300 nm to 1300 nm, preferably 350 nm to 800 nm.

Here, for example, the exposed area E1 can be left on the surface of the contact layer 41 by forming a resist pattern on a surface of the contact layer 41, vapor depositing the ohmic metal portion 43, and removing the resist pattern by lift-off. Alternatively, the ohmic metal portion 43 may be formed by forming a predetermined metal layer on the entire surface of the contact layer 41, forming a mask on the metal layer, and performing for example etching. In either case, as illustrated in FIG. 4A, the ohmic metal portion 43 can be formed on a part of the contact layer 41, the surface of the contact layer 41 which is not in contact with the ohmic metal portion 43, i.e., the exposed area E1, is formed.

The shape of the ohmic metal portion 43 may be a trapezoidal shape in a cross-sectional view in some cases as illustrated in FIG. 4A by way of schematic illustration only. The ohmic metal portion 43 may be formed into a rectangular shape or may have rounded corners in a cross-sectional view.

Further, in the contact portion formation step, the contact layer 41 of the exposed area E1 is removed so that a surface of the semiconductor stack 30 is exposed, thereby forming the contact portion 40 composed of the ohmic metal portion 43 and the contact layer 41a and providing the exposed surface E2 of the semiconductor stack 30 (FIG. 4B). Specifically, the contact layer 41 of an area other than the areas of the ohmic metal portion 43 that has been formed beforehand is etched to expose a surface of the p-type cap layer 39 which is the outermost surface layer of the semiconductor stack 30, thereby obtaining the contact layer 41a. For example, a resist mask may be formed on and around (approximately 2 μm to 5 μm) the ohmic metal portion 43, and the exposed area E1 of the contact layer 41 may be wet etched using tartaric acid-hydrogen peroxide mixture. Alternatively, wet etching may be performed using etchant solutions, such as inorganic acid-hydrogen peroxide mixture, organic acid-hydrogen peroxide mixture, and the like. Further, when a mask is formed on the above-described predetermined metal layer and etching is performed to form the ohmic metal portion 43 for providing the exposed area E1, etching can be performed continuously.

Note that the thickness of the contact portion 40 corresponds to the total thickness of the contact layer 41 (41a) and the ohmic metal portion 43 and may be 350 nm to 1500 nm, more preferably 400 nm to 1000 nm.

<Dielectric Layer Formation Step>

In the dielectric layer formation step, the dielectric layer 50 is formed on at least a part of the exposed surface E2 of the semiconductor stack 30 (FIG. 4C). Such a dielectric layer 50 may be formed for example as follows.

First, a dielectric layer is deposited on the entire surface of the semiconductor laminate 30 so as to cover the semiconductor laminate 30 and the contact portion 40. For the film deposition, a known technique such as plasma CVD or sputtering can be used. When a dielectric on a contact portion is formed in the dielectric layer 50 over the contact portion 40 in the surface of the deposited dielectric layer, a mask may be formed as desired and the dielectric on the contact portion may be removed by etching or the like. For example, the dielectric on the contact portion may be wet etched using buffered hydrofluoric acid (BHF) or the like.

Figure 8:
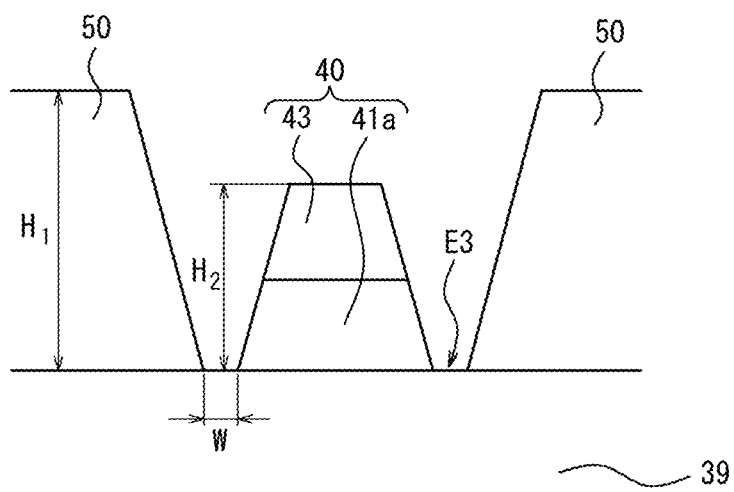
FIG. 8 is a schematic cross-sectional view illustrating a preferred mode of a vicinity of a dielectric layer and a contact portion in a semiconductor light-emitting element according to an embodiment of the present disclosure.

Note that, as illustrated in FIG. 8, it is also preferred that the dielectric layer 50 is formed on a part of the exposed surface E2 of the semiconductor stack 30 leaving an exposed portion E3 around the contact portion 40. The dielectric layer 50 and the exposed portion E3 described above may be formed for example as follows. First, a dielectric layer is deposited on the entire surface of the semiconductor laminate 30, and a window pattern completely surrounding the contact portion is formed using a resist above the contact portion 40 of the surface of the deposited dielectric layer. In this case, the window pattern is preferably 1 μm to 5 μm larger than the contact portion both in the width direction and the length direction. Using the thus formed resist pattern to remove the dielectric around the contact portion by etching, the dielectric layer 50 can be formed, and the exposed portion E3 is formed around the contact portion 40.

In order to ensure to obtain this structure, the width W of the exposed portion E3 is preferably 0.5 μm or more and 5 μm or less, more preferably 1 μm or more and 3.5 μm or less (see FIG. 8).

Here, the ratio of the area of the dielectric layer 50 in contact with the semiconductor stack 30 (contact area ratio) is preferably 80% or more and 95% or less. When the area of the contact portion 40 is reduced and the area of the dielectric layer 50 is increased, absorption of light by the contact portion can be reduced. Note that the contact area ratio can be measured on a wafer, and when the contact area ratio is calculated backwards from the state of singulated semiconductor light-emitting elements, the calculation can be performed assuming that the width of the semiconductor layer at each end (a region where the electric layer has been present) removed by singulation is 20 μm to 30 μm (40 μm to 60 μm for both ends in total).

Note that, in the dielectric layer formation step, the relationship between the thickness $H_1$ of the dielectric layer 50 and the thickness $H_2$ of the contact portion 40 is not limited in particular; however, as illustrated in FIG. 8, when the thickness of the dielectric layer 50 is expressed as $H_1$ and the thickness of the contact portion is expressed as $H_2$, $H_1 \geq H_2$ can be satisfied, and $H_1 > H_2$ is preferably satisfied. Under these conditions, the thickness of the dielectric layer 50 may be for example, but not limited to 360 nm to 1600 nm, more preferably 410 nm to 1100 nm. Further, the difference between the thickness $H_1$ of the dielectric layer and the thickness $H_2$ of the contact portion 40: $H_1$-$H_2$ is preferably 10 nm or more and 100 nm or less.

Moreover, the dielectric layer 50 may use $SiO_2$, SiN, ITO, AlN, and the like, and the dielectric layer 50 is preferably made of $SiO_2$ in particular. $SiO_2$ can easily be treated by etching using BHF etc.

<Reflective Layer Formation Step>

In the reflective layer formation step, the reflective layer 60 for reflecting light emitted from the semiconductor light-emitting layer 35 is formed on the dielectric layer 50 and the contact portion 40 (FIG. 5A). Note that, when the exposed portion E3 has been formed in the dielectric layer formation step, the reflective layer 60 is formed also on the exposed portion E3. The reflective layer 60 can employ any of a DBR, a reflective metal layer, a photonic crystal, refractive index differences induced by formation of partial void, or the like. Yet, for achieving readiness of fabrication and an adequate reflectivity to emitted light, the reflective layer 60 is preferably formed as a reflective metal layer. The reflective metal layer may use Au, Al, Pt, Ti, Ag, or the like, and a reflective metal layer mainly composed of Au is particularly preferred. In this case, Au preferably composes more than 50% by mass in the composition of the reflective metal layer, and more preferably Au composes 80% by mass or more. The reflective metal layer may include a plurality of metal layers; however, when it includes a metal layer formed of Au (hereinafter "Au metal layer"), the thickness of the Au metal layer is preferably more than 50% of the total thickness of the reflective metal layer. For example, the reflective metal layer may be constituted by a single layer formed of Au only; alternatively, the reflective metal layer may include two or more Au metal layers. In order to ensure bonding in the subsequent bonding step, the outermost surface layer of the reflective metal layer (the surface opposite to the semiconductor stack 30) is preferably an Au metal layer. For example, metal layers of Al, Au, Pt, and Au may be formed in this order on the dielectric layer 50, the exposed portion E3, and the contact portion 40 to obtain the reflective metal layer. The thickness of one Au metal layer in the reflective metal layer may be for example 400 nm to 2000 nm, and the thickness of each metal layer formed of a metal other than Au may be for example 5 nm to 200 nm. The reflective metal layer 60 can be formed on the dielectric layer 50, the exposed portion E3, and the contact portion 40 by a typical technique such as a vapor deposition process.

<Bonding Step>

In the bonding step, the support substrate 80 having a surface provided with the metal bonding layer 70 is bonded to the reflective layer 60 having the metal bonding layer 70 interposed therebetween (FIG. 5B). On a surface of the support substrate 80, the metal bonding layer 70 may be formed by sputtering, vapor deposition, etc. in advance. The metal bonding layer 70 and the reflective layer 60 are placed to face each other and put together, followed by bonding of the layers by thermocompression bonding at a temperature of approximately 250° C. to 500° C.

The metal bonding layer 70 bonded to the reflective layer 60 may be of metals such as Ti, Pt, and Au, or metals forming a eutectic alloy with gold (e.g., Sn), and is preferably formed from a laminate of those materials. For example, a laminate obtained by stacking Ti with a thickness of 400 nm to 800 nm, Pt with a thickness of 5 nm to 20 nm, and Au with a thickness of 700 nm to 1200 nm in this order on the surface of the support substrate 80 can be used as the metal bonging layer 70. Note that in order to facilitate bonding between the reflective layer 60 and the metal bonding layer 70, a Au metal layer is provided as the outermost surface layer of the metal bonding layer 70, and Au is also provided as a metal layer of the reflective layer 60 on the metal bonding layer 70 side to perform bonding between Au and Au by Au—Au diffusion bonding.

Note that a conductive Si substrate may be used as the support substrate 80, for example, or a conductive GaAs or Ge substrate may also be used. In addition to the semiconductor substrate described above, a metal substrate may be used. Or a submount substrate employing a heat-dissipating insulative substrate made from sintered MN or the like may also be used. The thickness of the support substrate 80 may be 100 μm or more and 500 μm or less, although it varies depending on the material used, and when a Si substrate or an GaAs substrate is used, a substrate with a thickness of less than 180 μm can be handled. A Si substrate is particularly preferable in terms of heat dissipation, brittleness, and cost.

<Substrate Removal Step>

In the substrate removal step, the growth substrate 10 is removed (FIG. 6A). The growth substrate 10 can be removed by wet etching for example using a hydrochloric acid diluent, and the wet etching can be stopped at the III-V compound semiconductor etch stop layer 20. The III-V compound semiconductor etch stop layer 20 may be removed by wet etching, for example, using an etchant solution of sulfuric acid-hydrogen peroxide mixture.

<Surface Roughening Step>

In the surface roughening step, the surface of the light extraction face (the surface other than the flat surface 31F) of the n-type cladding layer 31 is roughened so as to have a surface roughness Ra of 0.03 μm or more and have a random irregularity pattern to form random recesses 31C (FIG. 6B). The surface of the light extraction face is preferably roughened so as to have a skewness Rsk of −1 or more. The surface roughening step can be carried out by masking the top electrode region and then roughening the surface. Referring to FIGS. 9A to 9D, a description will be made on the surface roughening step and a protective film formation step which is preferably carried out subsequently.

<<Masking of Top Electrode Region>>

Figure 9A:
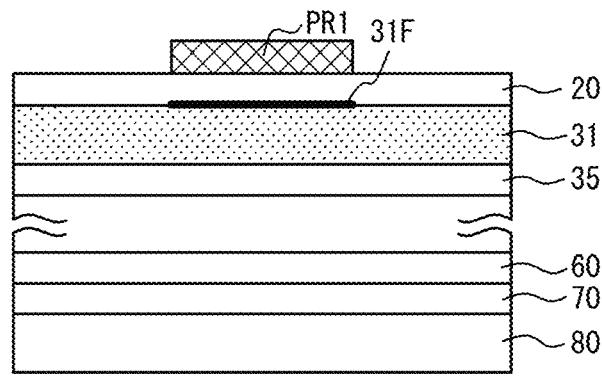
FIGS. 9A to 9D are schematic cross-sectional views illustrating a preferred mode of a surface roughening step in the manufacturing steps of a semiconductor light-emitting element according to an embodiment of the present disclosure.

First, a top electrode formation region 31F of the etch stop layer 20 that has been exposed in the substrate removal step or a region over the second conductivity type cladding layer (n-type cladding layer 31) is masked using a photoresist PR1 or the like (FIG. 9A). As will be described later, this step may be carried out simultaneously with a first step for protecting the electrode region upon etching the III-V group compound semiconductor etch stop layer 20 for forming a pattern in the surface roughening step. In the case where a top electrode has been formed prior to the surface roughening step, the top electrode may be masked with a photoresist subsequent to the formation of the top electrode. Although the top electrode may be formed on the second conductivity type cladding layer (n-type cladding layer 31), the top electrode formed on the etch stop layer 20 can increase the reliability of the electrode. FIGS. 9A to 9D are schematic diagrams of a mode in which a top electrode is formed on the etch stop layer 20.

The surface roughening processing can be carried out by mechanical surface roughening, wet etching, dry etching, or a combination thereof. Surface roughening techniques may be combined in any combinations as long as the surface is roughened so as to have a surface roughness Ra of the irregularity pattern of the n-type cladding layer 31 of 0.03 μm or more and have a random roughened surface, and preferably the skewness Rsk satisfying Rsk ≥−1 is obtained.

Hereinafter, a description will be made on an example of first to third steps which are included in a preferred embodiment of the surface roughening processing step, and a protective film formation step which is preferably carried out subsequently. Surface roughening processing can also be achieved using methods other than the following example.

<<First Step (Protection of Electrode Region)>>

The aforementioned FIG. 6A corresponds to the element after the growth substrate 10 is removed. After the growth substrate 10 is removed, in the first step, the region of the flat region 31F of the n-type cladding layer 31 in which a top electrode is to be formed or a top electrode has been formed, is protected with a material that can withstand mechanical surface roughening to be carried out later. The material may have a hardness equal to or higher than the hardness of abrasive grains used in mechanical machining (i.e., grinding) and can be readily formed and patterned, and can be selected from $SiO_2$, SiN, TiN, and the like, for example.

The protection layer may be patterned by etching or lift-off using a photolithography.

<<Second Step (Mechanical Surface Roughening)>>

Figure 9B:
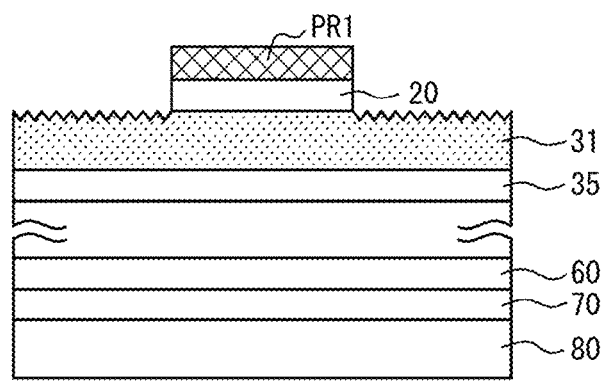

Subsequent to the first step, in the second step, the surface (light extraction face) other than the region in which a top electrode is to be formed is grinded (FIG. 9B). Grinding can be carried out by bonding the back surface of the wafer to a support plate with wax or the like, and roughly grinding the surface using a polish sheet or a lap plate at a certain rotational speed while allowing a slurry containing abrasive grains to flow, to thereby form random irregularities.

In this step, the etch stop layer 20 may be present at the start of the grinding, or may have been removed by etching in advance. When the etch stop layer 20 has not been removed, the lap time may be adjusted so that the etch stop layer 20 is completely grinded during the grinding.

<<Third Step (Etching Step)>>

The surface provided with the irregularities in the second step is etched to eliminate any strain on the surface and clean the surface, and to make the irregularities steeper.

A commercially available etchant solution, such as an etchant solution of hydrochloric acid-acetic acid mixture (hydrochloric acid:acetic acid=1:2) or Pure Etch F106 manufactured by Hayashi Pure Chemical Ind., Ltd., can be used for etching, for example.

The magnitude of the irregularities generated in the second step, and the etchant solution and etching conditions (temperature, time, presence or absence of stirring, etc.) used in the third step can be arbitrarily combined. InP is a material relatively resistant to etching as compared with other compound semiconductor materials, and it is suffice to form irregularities so that the surface roughness Ra of the n-type cladding layer 31 satisfies Ra ≥0.03 or more and Rsk ≥−1 is satisfied.

<Protection Film Formation Step>

Figure 9C:
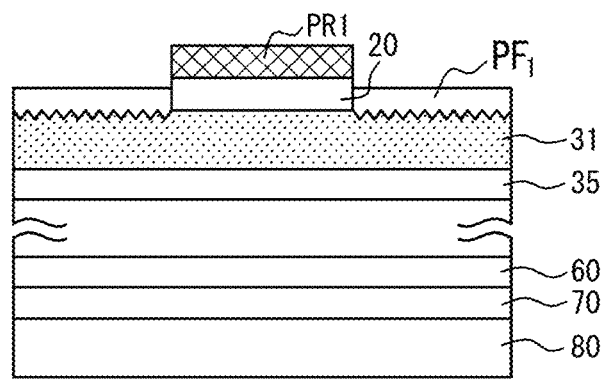
Figure 9D:
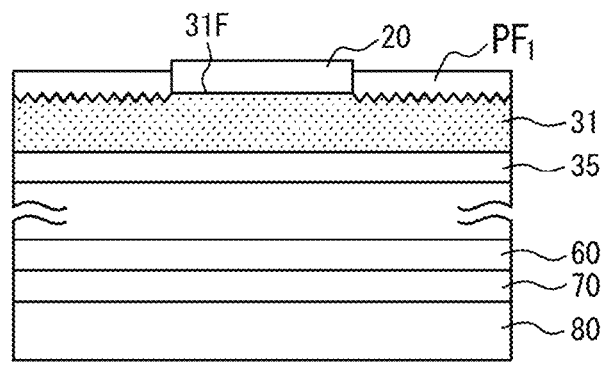

After the center portion of the top electrode is masked with the resist, a protective film $PF_1$ is formed on the entire surface including the irregular surface of the n-type cladding layer 31 (FIG. 9C). The resist is then lifted off to thereby expose the top electrode (FIG. 9D).

For the film deposition, a known technique such as plasma CVD or sputtering can be used. When no resist has been applied on the top electrode, a mask may be formed subsequent to a formation of a protective film and the protective film on the top electrode may be removed in buffered hydrofluoric acid (BHF) or the like.

Note that, although not illustrated, the manufacturing method according to an embodiment of the present disclosure preferably further includes a grinding step of grinding the support substrate 80 to a thickness in a range of 80 µm or more and less than 200 µm. In this embodiment, a Si substrate may be used as the support substrate 80, and the support substrate 80 would not be broken even if it is ground to a thickness of less than 200 µm in this case. Further, the support substrate 80 can be ground to a thickness of 150 µm or less, or may be ground to a thickness of 100 µm or less. However, when the support substrate 80 is ground to a thickness of less than 80 µm, even a Si substrate would be damaged. Therefore, the lower limit of the thickness is preferably set to 80 µm. Further, when the thickness of the support substrate 80 is 80 µm or more, the semiconductor light-emitting element 100 is sufficiently handleable.

The manufacturing method according to a preferred embodiment may further include a step of forming a top electrode 93 on the surface of the semiconductor laminate 30, as illustrated in FIG. 7, after the semiconductor light-emitting element 100 is fabricated. When the support substrate 80 is conductive, the method may further include a step of forming a back electrode 91 on the back surface of the support substrate 80. The top electrode 93 may include a wiring portion 93 and a pad portion 93. Through such steps, a semiconductor light-emitting element 100' can be fabricated. The back electrode 91 and the top electrode 93 can be formed by a known technique; for example, sputtering, electron-beam physical vapor deposition, resistance heating, etc. can be used.

Because an n-type InP substrate is used as the growth substrate 10 in this embodiment for convenience of description, the layers formed on the growth substrate 10 have n-type and p-type conductivity types as described above. However, it can naturally be understood that those layers have n-type and p-type conductivity types in reverse order.

Moreover, as depicted in the semiconductor light-emitting element in FIGS. 1 and 2, prior to dicing, epitaxially formed semiconductor layers 3a, 3b, and 3c may be etched mesa.

Although the above-mentioned embodiment of the manufacturing method has been described assuming fabrication of the bonding-type semiconductor light-emitting element 100, the present disclosure is not limited to a bonding-type semiconductor light-emitting element. The method of manufacturing a semiconductor light-emitting element according to the present disclosure may include: forming, on a substrate in this order, a reflective layer, a first conductivity type cladding layer made of InGaAsP containing at least In and P, a semiconductor light-emitting layer having an emission central wavelength of 1000 nm to 2200 nm, and a second conductivity type cladding layer made of InGaAsP containing at least In and P, the second conductivity type cladding layer being configured to be on a light extraction side; and a surface roughening step of, after forming the second conductivity type cladding layer, roughening a surface of a light extraction face of the second conductivity type cladding layer so as to have a surface roughness Ra of 0.03 µm or more and have a random irregularity pattern. The surface roughening step preferably includes roughening the surface of the light extraction face so as to have a skewness Rsk of −1 or more.

EXAMPLES

Experimental Example 1

Example 1

The present disclosure will be described in more detail below using examples. However, this disclosure is not limited to the following examples. A semiconductor light-emitting element according to Example 1 was fabricated in accordance with the process steps illustrated in FIGS. 3A to 6B, and 9. Specifically, the semiconductor light-emitting element was fabricated as follows.

First, on the (100) plane of an n-type InP substrate, an n-type $In_{0.57}Ga_{0.43}As$ etch stop layer (20 nm), an n-type InP cladding layer (thickness: 3.5 µm), an i-type InP spacer layer (thickness: 300 nm), a semiconductor light-emitting layer having a quantum well structure with an emission wavelength of 1300 nm (130 nm in total), an i-type InP spacer layer (thickness: 300 nm), a p-type InP cladding layer (thickness: 4.8 µm), a p-type $In_{0.8}Ga_{0.20}As_{0.5}P_{0.5}$ cap layer (thickness: 50 nm), and a p-type $In_{0.57}Ga_{0.43}As$ contact layer (thickness: 100 nm) were sequentially formed by MOCVD. Note that in forming the semiconductor light-emitting layer having a quantum well structure, ten $In_{0.73}Ga_{0.27}As_{0.5}P_{0.5}$ well layers (thickness: 5 nm) and ten InP barrier layers (thickness: 8 nm) were alternately stacked.

Figure 10A:
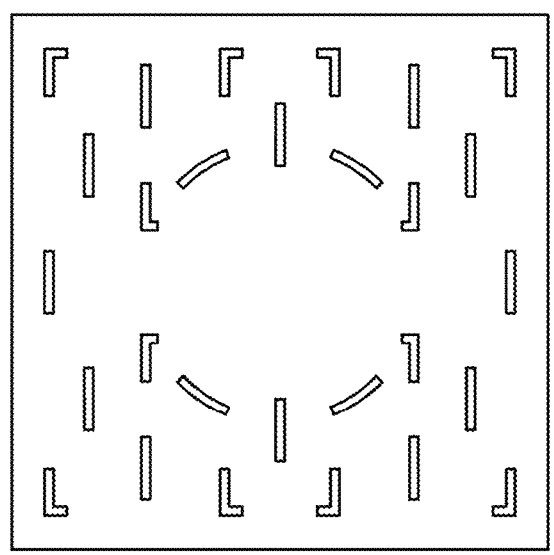
FIG. 10A is a schematic top view illustrating a pattern of an ohmic electrode portion of Experimental Example 1.

On the p-type $In_{0.57}Ga_{0.43}As$ contact layer, a p-type ohmic electrode portion (Au/AuZn/Au, total thickness: 530 nm) was formed into islands distributed as illustrated in FIG. 10A. When forming this pattern, a resist pattern was formed and an ohmic electrode was then vapor deposited, followed by lift-off of the resist pattern. When the semiconductor layer of the wafer in this state was observed in a top view using an optical microscope, the contact area ratio of the p-type ohmic electrode portion with respect to the semiconductor layer was 4.5%. Note that the outer size of the object depicted in FIG. 10A is 380 µm square.

Next, by using the ohmic electrode portion as a mask, the p-type $In_{0.57}Ga_{0.43}As$ contact layer was removed, except for the area where the ohmic electrode portion was formed, by wet etching using tartaric acid-hydrogen peroxide mixture. After that, a dielectric layer (thickness: 700 nm) made of $SiO_2$ was formed on the entire surface of the p-type $In_{0.80}Ga_{0.20}As_{0.50}P_{0.50}$ cap layer by plasma CVD. A window pattern having a shape extending over 3 µm each in the width direction and the longitudinal direction in an area above the p-type ohmic electrode portion was formed using a resist, and the dielectric layer on and around the p-type ohmic electrode portion was removed by wet etching using BHF to expose the p-type $In_{0.80}Ga_{0.20}As_{0.50}P_{0.50}$ cap layer. At this time, the height $H_1$ (700 nm) of the dielectric layer on the p-type $In_{0.80}Ga_{0.20}As_{0.50}P_{0.50}$ cap layer was larger than the height $H_2$ (630 nm) of the contact portion composed of the p-type contact layer (thickness: 130 nm) and the p-type ohmic electrode portion (thickness: 530 nm) by 70 nm. When the semiconductor layer of the wafer in this state was observed in a top view using an optical microscope, the contact area ratio of the dielectric layer ($SiO_2$) was 90%.

Next, a reflective metal layer (Al/Au/Pt/Au) was formed on the entire surface of the p-type $In_{0.80}Ga_{0.20}As_{0.50}P_{0.50}$ cap layer by vapor deposition. The thickness of the metal layers in the reflective metal layer was 10 nm, 650 nm, 100 nm, and 900 nm in this order.

On the other hand, a metal bonding layer (Ti/Pt/Au) was formed on a conductive Si substrate serving as a support substrate (thickness: 300 μm). The thickness of the metal layers in the metal bonding layer was 650 nm, 10 nm, and 900 nm in this order.

The reflective metal layer and the metal bonding layer were placed to face one another and were subjected to thermocompression bonding at 300° C. Further, the InP substrate was removed by wet etching using a hydrochloric acid diluent.

Next, the surface of the light extraction face of the n-type InP cladding layer was subjected to surface roughening. First, the etch stop layer other than the top electrode formation region was masked with a positive photoresist. A SiO$_2$ film with a thickness of 50 nm was then formed by plasma CVD, and a TiN film with a thickness of 100 nm was formed on the SiO$_2$ film to thereby protect the top electrode formation region with the SiO$_2$ film and the TiN film. The photoresist was dissolved to remove the SiO$_2$ film and the TiN film other than the top electrode formation region by lift-off. The etch stop layer and the n-type InP cladding layer in the unprotected portion were then lapped on a lap plate while a slurry of alumina abrasive grains (#4000 having an average grain size of 3 μm) mixed with a lubricant was allowed to flow. In this step, the etch stop layer having a thickness of 20 nm was completely removed by adjusting the lap time to grind the etch stop layer, to thereby form irregularities on the surface of the n-type InP cladding layer by machining. Thereafter, the irregularities on the surface of the n-type InP-cladding layer were further etched using an etchant solution of hydrochloric acid-acetic acid mixture (hydrochloric acid:acetic acid=1:2).

Figure 10B:
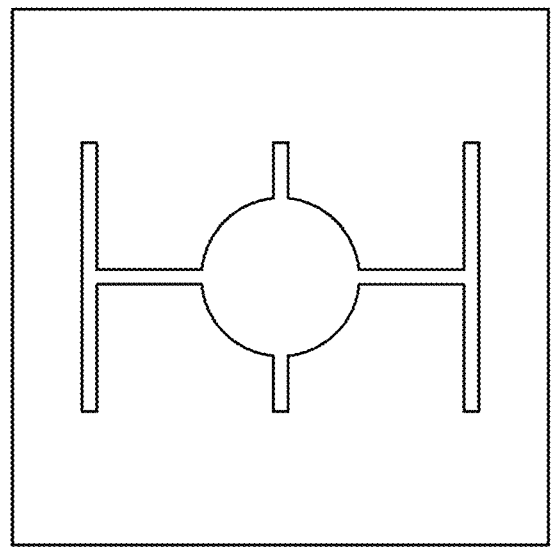
FIG. 10B is a schematic top view illustrating a pattern of a top electrode of Experiment Example 1.

Next, the TiN film used for the protection in the surface roughening was removed using a mixture of sulfuric acid and hydrogen peroxide, and the SiO$_2$ film was removed using BHF. Then, on the exposed etch stop layer in the top electrode formation region, an n-type electrode (Au (thickness: 10 nm)/Ge (thickness: 33 nm)/Au (thickness: 57 nm)/Ni (thickness: 34 nm)/Au (thickness: 800 nm)/Ti (thickness: 100 nm)/Au (thickness: 1000 nm)) was formed as a wiring portion of a top electrode by resist patterning, vapor deposition of the n-type electrode, and lift-off of the resist pattern as illustrated in FIG. 10B. Further, a pad portion (Ti (thickness: 150 nm)/Pt (thickness: 100 nm)/Au (thickness: 2500 nm)) was formed on the n-type electrode to obtain the top electrode having a pattern as illustrated in FIG. 10B. Note that the outer size of the object depicted in FIG. 10B is 380 μm square as with FIG. 10A.

Finally, the semiconductor layers between devices (width: 60 μm) were removed by mesa etching to form dicing lines. A back electrode (Ti (thickness: 10 nm)/Pt (thickness: 50 nm)/Au (thickness: 200 nm)) was formed on the back surface of the Si substrate, and chip singulation was performed by dicing to obtain a semiconductor light-emitting element of Example 1. The chip size was 350 μm×350 μm.

Examples 2 and 3

Semiconductor light-emitting elements according to Examples 2 and 3 were fabricated as follows. Similarly to Example 1, the semiconductor layers between devices (width: 60 μm) were removed by mesa etching to form dicing lines. A SiO$_2$ protective film was formed by plasma CVD so as to cover the n-type InP cladding layer that had been subjected to surface roughening and side surfaces of the element, except for a bonding region (circular portion at the center) of the top electrode. The same conditions were used both in Examples 2 and 3 except that the time to form the SiO$_2$ protective film was adjusted to thereby obtain SiO$_2$ protective films of 215 nm and 645 nm in Examples 2 and 3, respectively.

Examples 4 to 7

Semiconductor light-emitting elements according to Examples 4 to 7 were fabricated in the same manner as in Example 1 except that the etching time in the hydrochloric acid-acetic acid solution in the surface roughening in Example 1 was controlled to modify the surface roughness.

Comparative Example 1

A semiconductor light-emitting element according to Comparative Example 1 was fabricated in the same manner as in Example 1 except that the surface of an n-type InP cladding layer was not subjected to surface roughening.

Comparative Example 2

Figure 11:
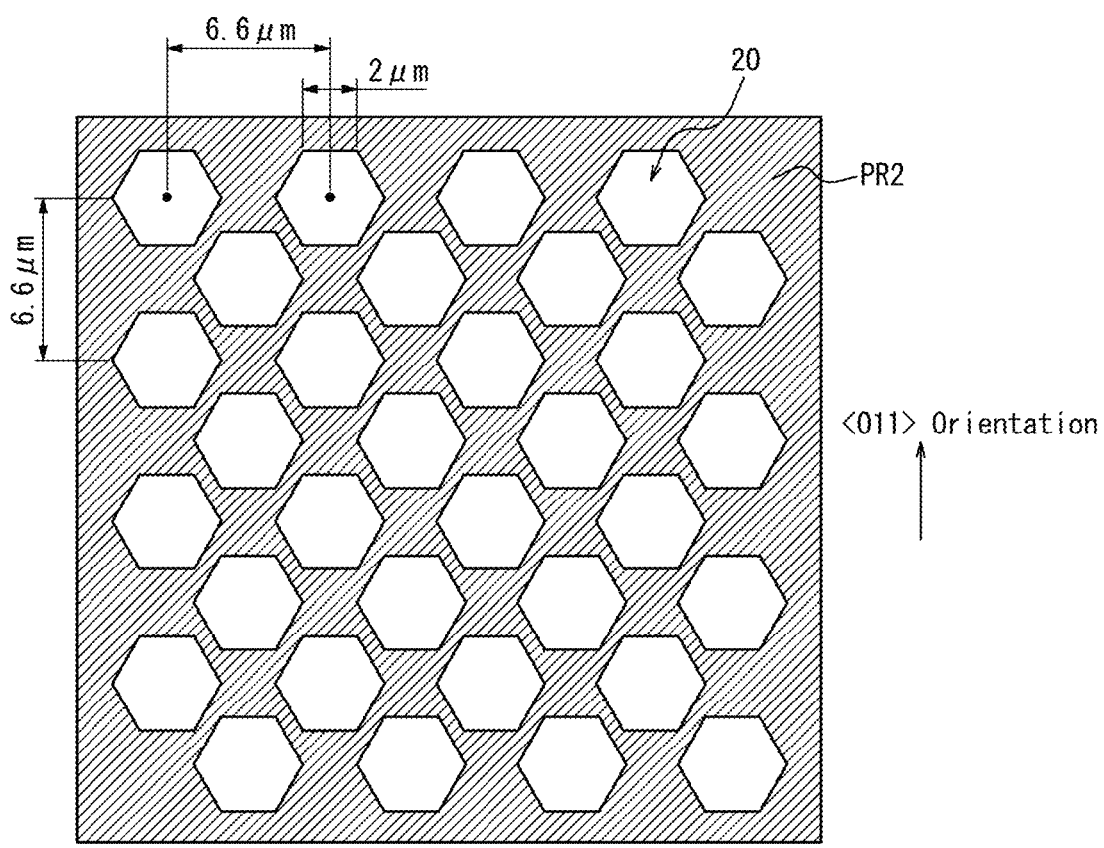
FIG. 11 is a schematic plan view of a mask pattern used in Comparative Example 3.
Figure 12A:
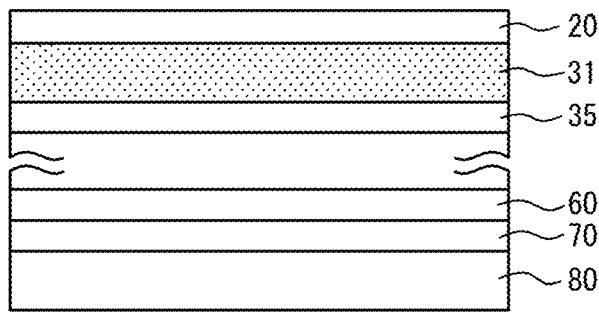
FIGS. 12A to 12D are schematic cross-sectional views illustrating manufacturing steps of surface roughening in Comparative Example 3.
Figure 12B:
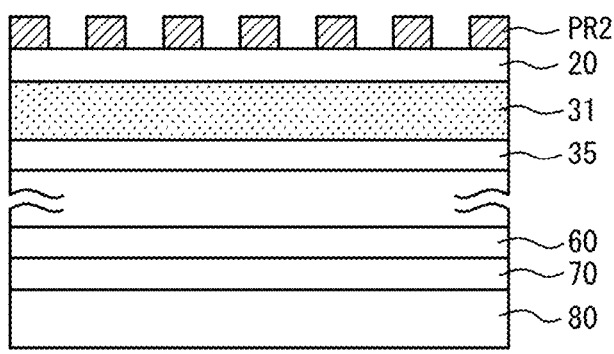
Figure 12C:
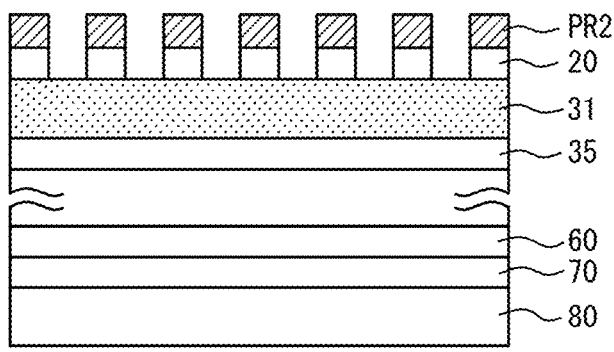
Figure 12D:
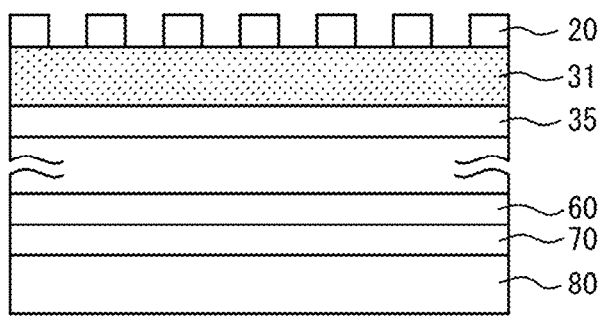
Figure 13A:
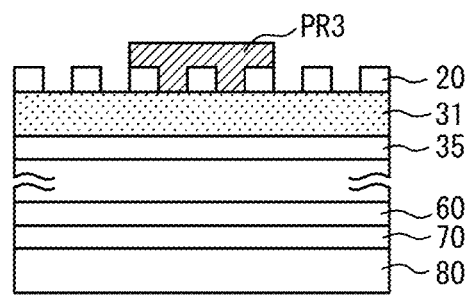
FIGS. 13A to 13C are schematic cross-sectional views illustrating the manufacturing steps subsequent to FIGS. 12A to 12D of the surface roughening in Comparative Example 3.
Figure 13B:
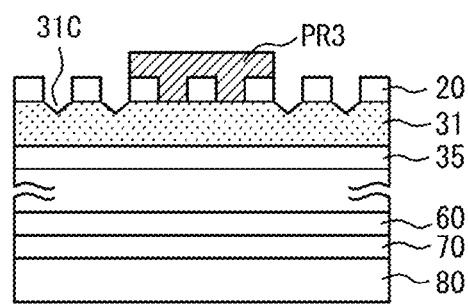
Figure 13C:
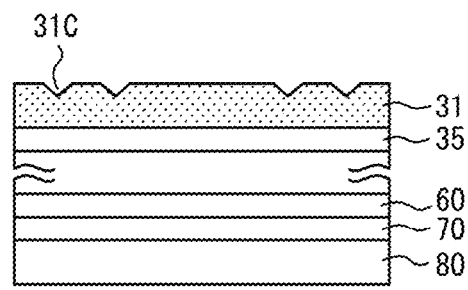
Figure 14A:
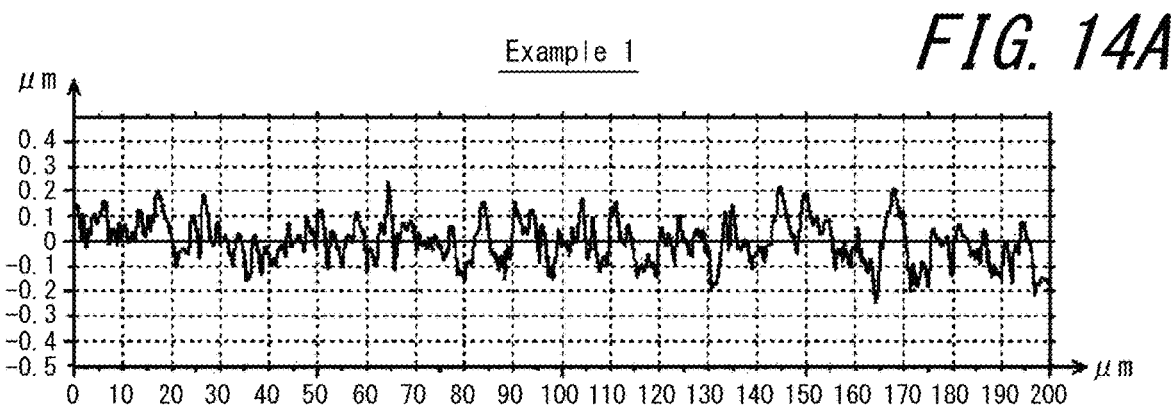
FIG. 14A is a graph indicating a result of a surface profile analysis of an n-type cladding layer in Example 1.
Figure 14B:
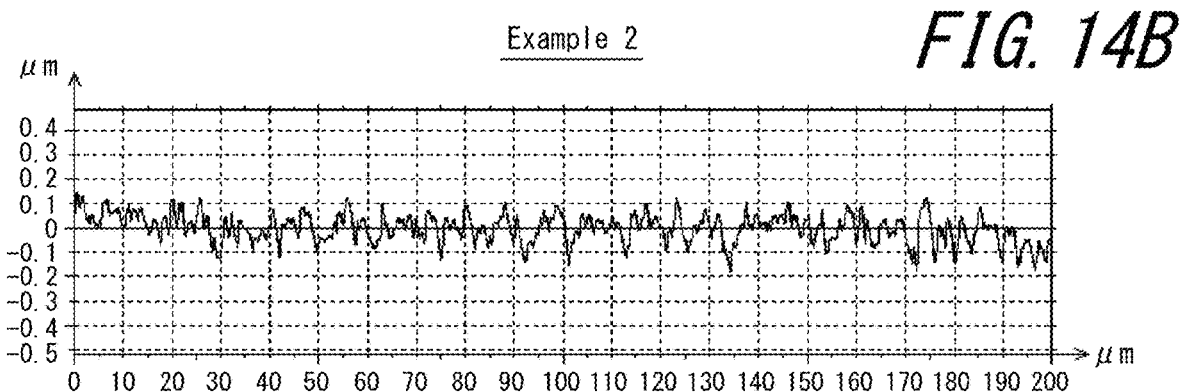
FIG. 14B is a graph indicating a result of a surface profile analysis of an n-type cladding layer in Example 2.
Figure 14C:
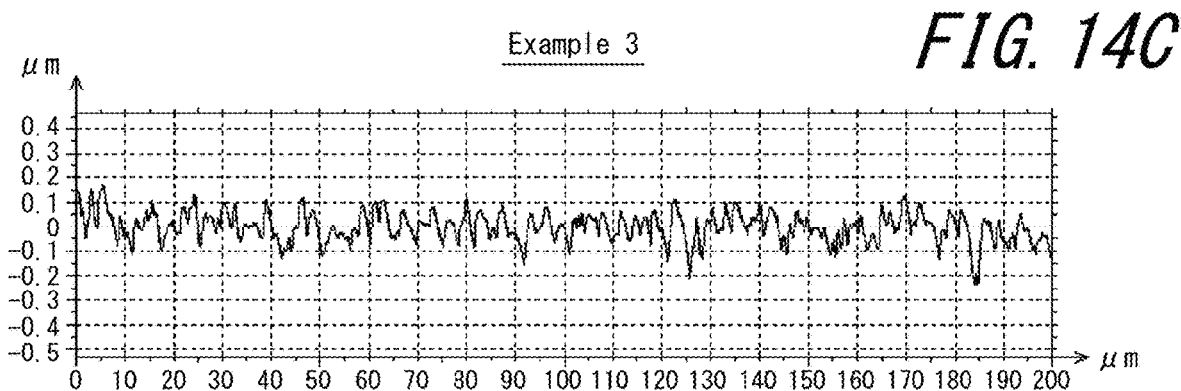
FIG. 14C is a graph indicating a result of a surface profile analysis of an n-type cladding layer in Example 3.
Figure 14D:
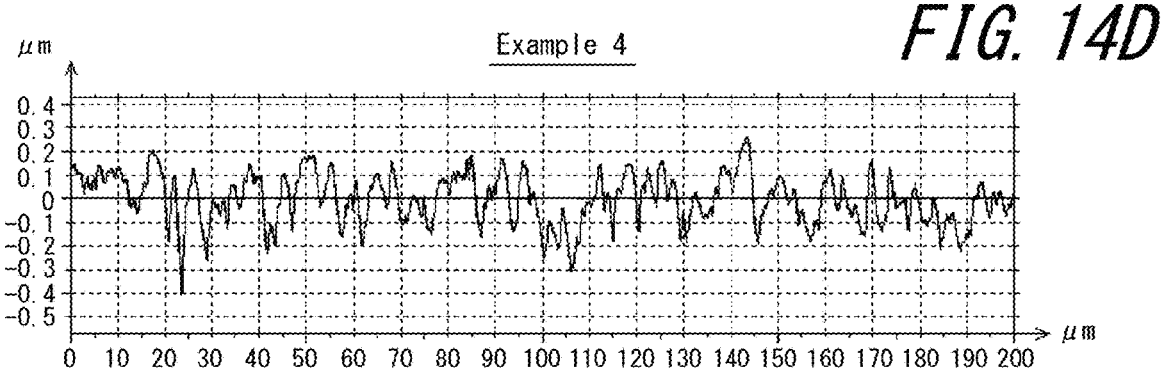
FIG. 14D is a graph indicating a result of a surface profile analysis of an n-type cladding layer in Example 4.
Figure 14E:
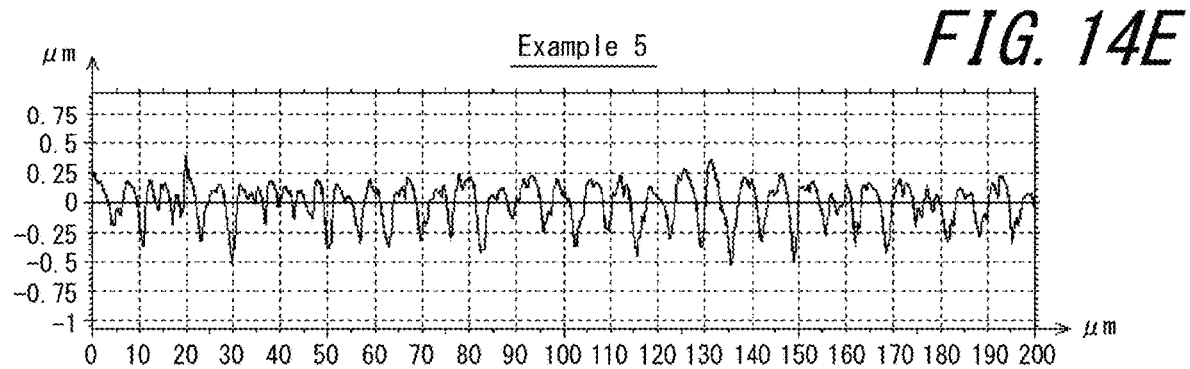
FIG. 14E is a graph indicating a result of a surface profile analysis of an n-type cladding layer in Example 5.
Figure 14F:
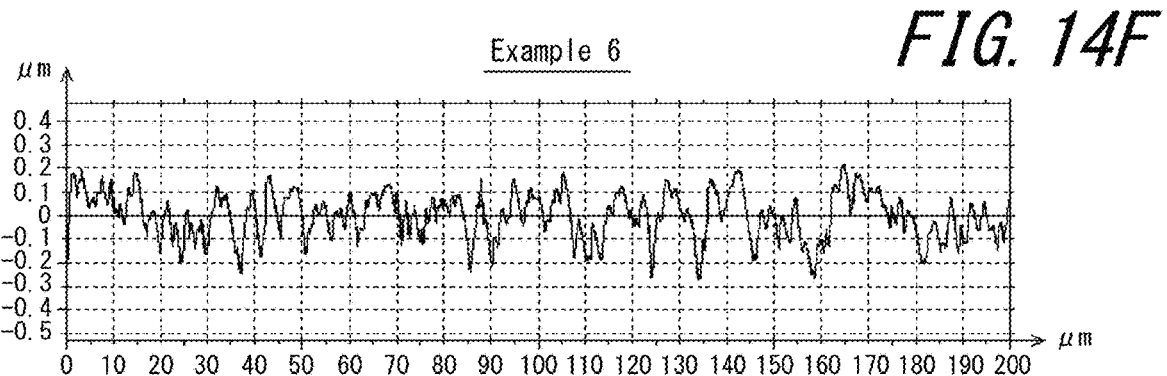
FIG. 14F is a graph indicating a result of a surface profile analysis of an n-type cladding layer in Example 6.
Figure 14G:
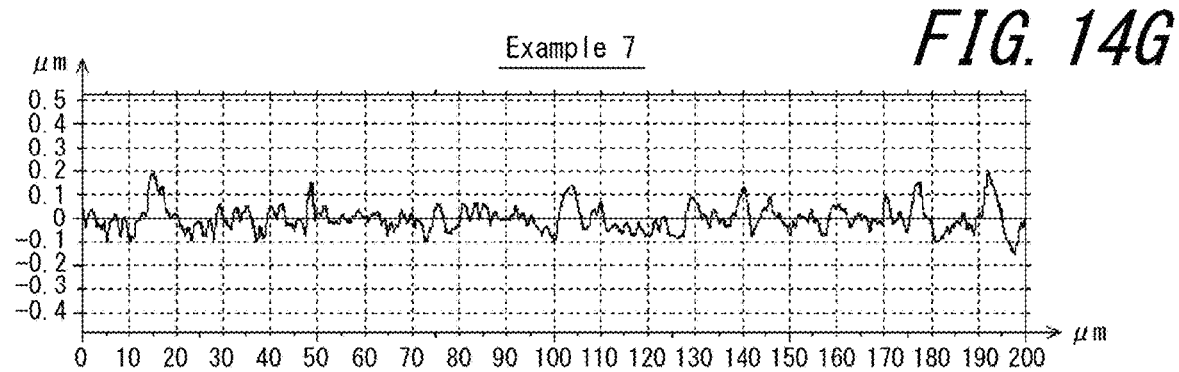
FIG. 14G is a graph indicating a result of a surface profile analysis of an n-type cladding layer in Example 7.

A semiconductor light-emitting element according to Comparative Example 2 was fabricated in the same manner as in Example 1 except that surface roughening was carried out as follows. Initially, in surface roughening of the n-type InP cladding layer, a pattern was formed using a positive photoresist PR2. As depicted in FIG. 11, the pattern of the photoresist PR2 was such that the centers of the recesses were arranged two-dimensionally in an isosceles triangular lattice arrangement and the distance between the <011>orientation and the centers in the direction orthogonal to the <011>orientation was 6 μm. Further, each recess was formed into a regular hexagon (length of each side: 2 μm). Subsequently, the pattern was transferred to the n-type In$_{0.57}$Ga$_{0.43}$As etch stop layer in an etchant solution of tartaric acid-hydrogen peroxide mixture (FIGS. 12A to 12C). Thereafter, the photoresist PR2 was rinsed and removed (FIG. 12D), and another photoresist PR3 was provided on the upper surface of the electrode formation region in the n-type InP cladding layer (FIG. 13A). Thereafter, the n-type InP cladding layer was etched in an etchant solution of hydrochloric acid-acetic acid mixture (hydrochloric acid:acetic acid=1:2) (FIG. 13B), and the n-type In$_{0.57}$Ga$_{0.43}$As etch stop layer was removed by wet etching in an etchant solution of sulfuric acid-hydrogen peroxide mixture (sulfuric acid:hydrogen peroxide:water=3:1:1) (FIG. 13B). This provided an irregularity pattern exhibiting a dependency on the crystal orientation.

Comparative Example 3

A semiconductor light-emitting element according to Comparative Example 3 was fabricated by fabricating a semiconductor light-emitting element in the same manner as in Comparative Example 2, and forming a SiO$_2$ protective film (thickness: 500 nm) so as to cover the n-type InP cladding layer that had been subjected to surface roughening and side surfaces of the element in the same manner as in Example 2.

Comparative Examples 4 to 7

Semiconductor light-emitting elements according to Comparative Examples 4 to 7 were fabricated in the same manner as in Comparative Example 2 except that the diameter and pitch of the pattern for the surface roughening in Comparative Example 2 were changed to modify the profiles of roughened surfaces.

<Measurement of Roughness of Roughened Surface>

The surface profile of a roughened surface of an n-type cladding layer on a wafer after the surface roughening (before dicing) was analyzed using a contact-type surface profile analyzer P-6 manufactured by KLA Tencor Corp. A stylus used had a stylus tip radius of 2 μm, and measurement conditions were as follows: a stylus contact pressure of 2 mg, a scan speed of 2 μm/sec, and a sampling frequency of 50 Hz. The measurement distance (reference length) was set to 200 μm. The values of the surface roughness Ra and the skewness Rsk were automatically calculated by the surface profile analyzer.

Figure 15A:
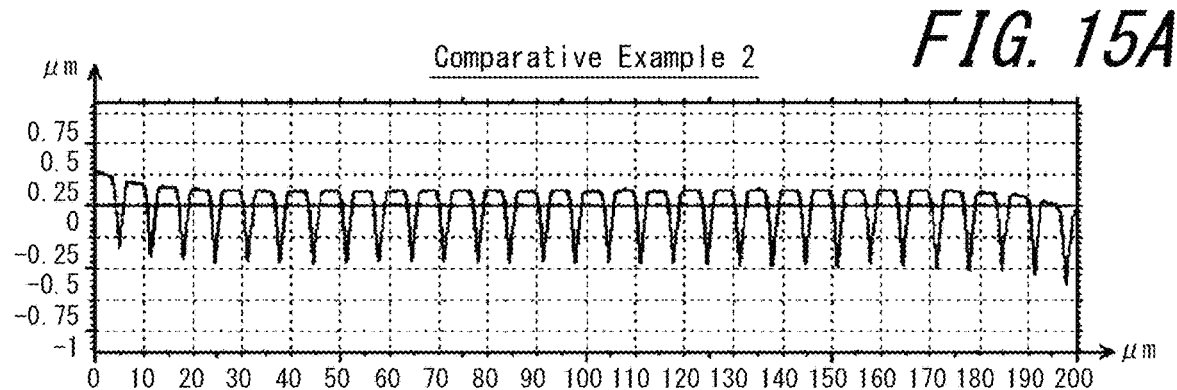
FIG. 15A is a graph indicating a result of a surface profile analysis of an n-type cladding layer in Comparative Example 2.
Figure 15B:
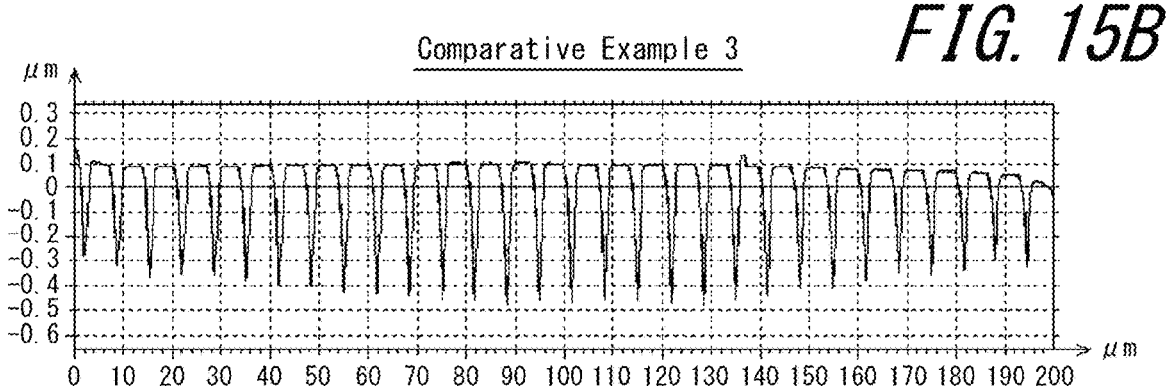
FIG. 15B is a graph indicating a result of a surface profile analysis of an n-type cladding layer in Comparative Example 3.
Figure 15C:
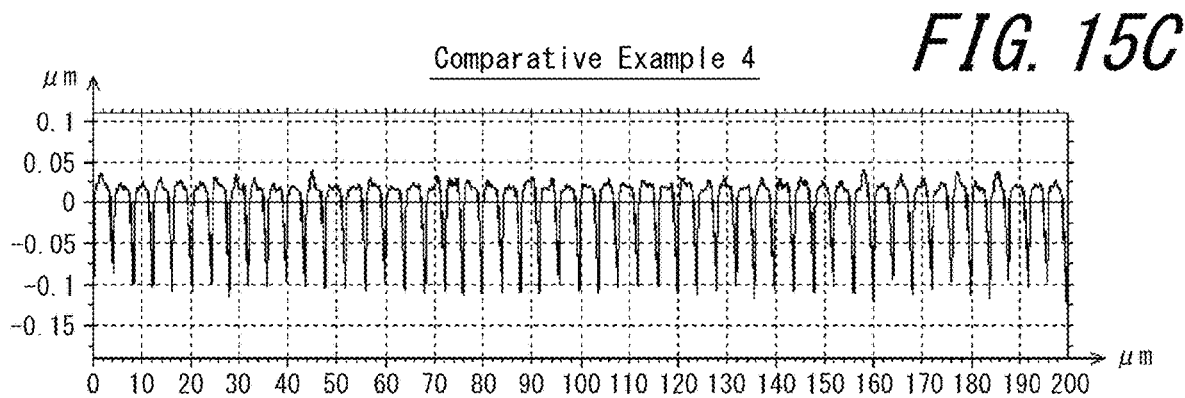
FIG. 15C is a graph indicating a result of a surface profile analysis of an n-type cladding layer in Comparative Example 4.
Figure 15D:
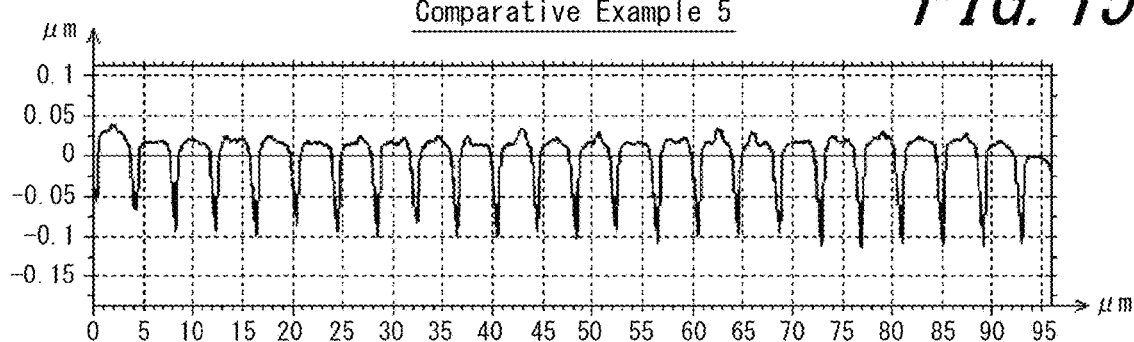
FIG. 15D is a graph indicating a result of a surface profile analysis of an n-type cladding layer in Comparative Example 5.
Figure 15E:
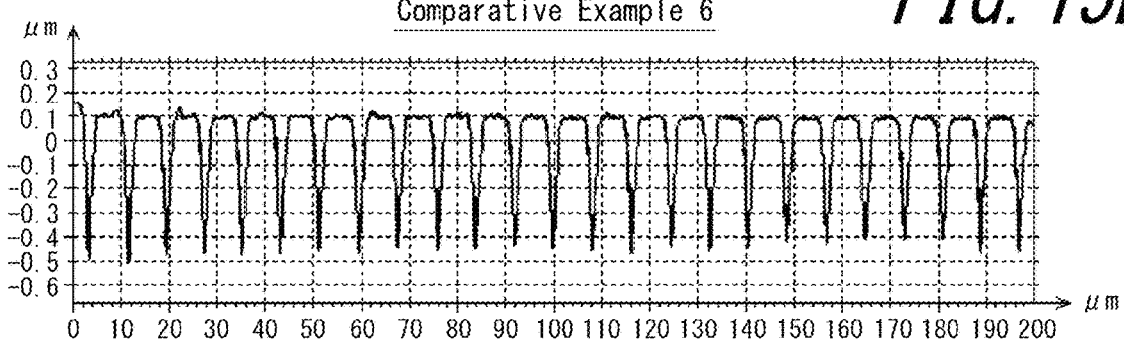
FIG. 15E is a graph indicating a result of a surface profile analysis of an n-type cladding layer in Comparative Example 6.
Figure 15F:
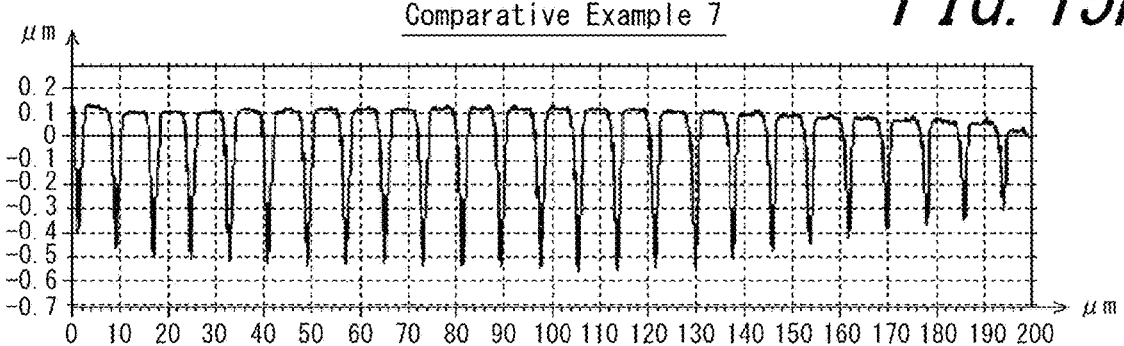
FIG. 15F is a graph indicating a result of a surface profile analysis of an n-type cladding layer in Comparative Example 7.

Examples 1 to 7. Further, referring to surface profile data in Comparative Examples 4, 5 and 7 (FIGS. 15C, D, and F), for example, the surface roughness Ra of the regions without grooves (flat pattern regions) was each 0.004 μm although very small peaks caused by the mask were observed in the regions. Ra of the regions without grooves was 0.010 μm or less, indicating that the surface on the light extraction side of each of Comparative Examples was not a "random roughened surface". The pitches between the flat surfaces in Comparative Examples 2, 3, 4, 5, 6, and 7 were 6.6 μm, 6.6 μm, 4.0 μm, 4.0 μm, 8.0 μm, and 8.0 μm, respectively. In contrast, regions without groove as those observed in Comparative Examples were not observed in Examples 1 to 7, indicating that "random roughened surfaces" were formed.

|  | Roughness (n-type InP cladding layer) | | Roughness (surface of protective film) | | | | | |
| --- | --- | --- | --- | --- | --- | --- | --- | --- |
|  | Ra (μm) | Rsk | Ra (μm) | Rsk | Po (mW) | λp (nm) | Vf (V) | Rating |
| Example 1 | 0.062 | 0.235 | — | — | 2.60 | 1296.4 | 0.936 | A |
| Example 2 | 0.062 | 0.235 | 0.041 | −0.455 | 2.76 | 1295.3 | 0.934 | A |
| Example 3 | 0.062 | 0.235 | 0.045 | −0.259 | 2.69 | 1294.5 | 0.933 | A |
| Example 4 | 0.085 | −0.176 | — | — | 2.43 | 1315.0 | 0.956 | A |
| Example 5 | 0.142 | −0.734 | — | — | 1.75 | 1309.2 | 0.962 | B |
| Example 6 | 0.077 | −0.422 | — | — | 2.63 | 1293.8 | 0.939 | A |
| Example 7 | 0.038 | 0.623 | — | — | 1.96 | 1300.7 | 0.943 | B |
| Comparative Example 1 | 0.003 | 0.970 | — | — | 1.39 | 1294.3 | 0.929 | C |
| Comparative Example 2 | 0.145 | −1.350 | — | — | 2.26 | 1306.0 | 0.936 | C |
| Comparative Example 3 | 0.145 | −1.350 | 0.120 | −1.600 | 2.83 | 1280.9 | 0.999 | C |
| Comparative Example 4 | 0.028 | −1.630 | — | — | 2.41 | 1275.0 | 0.996 | C |
| Comparative Example 5 | 0.024 | −1.770 | — | — | 2.71 | 1274.5 | 0.998 | C |
| Comparative Example 6 | 0.126 | −1.590 | — | — | 2.28 | 1274.2 | 0.999 | C |
| Comparative Example 7 | 0.143 | −1.680 | — | — | 2.28 | 1275.2 | 1.001 | C |

Surface profile data of Examples 1 to 7 are depicted in FIGS. 14A to 14G, respectively. As for Comparative Examples, surface profile data of Comparative Examples 2 to 7 in which the surfaces were roughened using a mask are depicted in FIGS. 15A to 15F, respectively. In Examples 2 and 3 and Comparative Example 3 in which a $SiO_2$ protective film was formed, the surface of an n-type InP cladding layer prior to the formation of the protective film was analyzed, as well as the surface of the protective film after the formation of the protective film. The results of analyses of the surfaces of the respective n-type InP cladding layers are indicated in the drawings.

Figure 16:
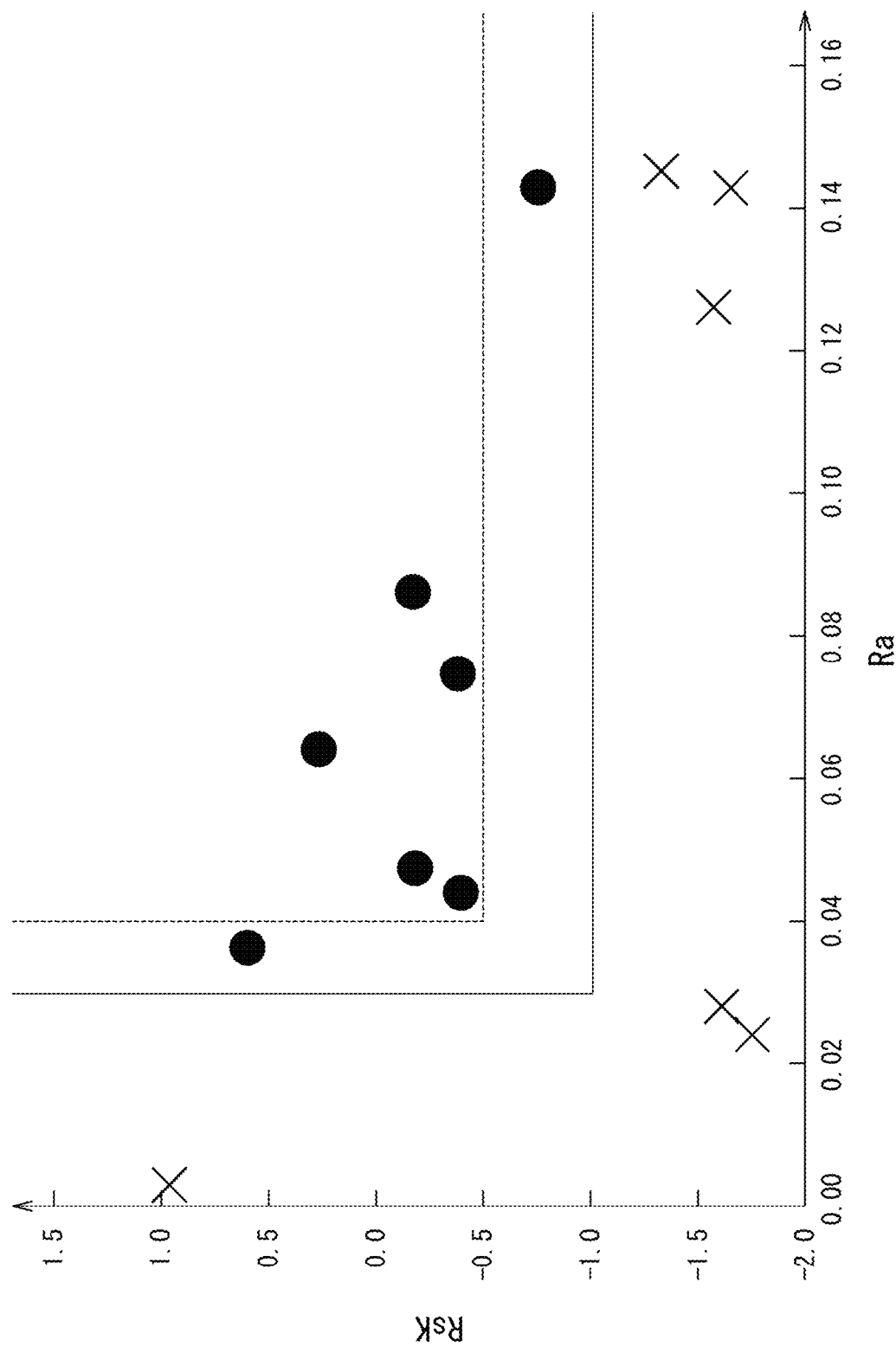
FIG. 16 is a graph indicating the relationship between the surface roughness Ra and the skewness Rsk in Experimental Example 1.

Random irregularities were formed and peaks and valleys were steep in all of Examples 1 to 7. In contrast, in Comparative Examples 2 to 7, because the patterns were formed, peaks and valleys were formed regularly, so that the pitches of the irregularities were regular and the valleys of recesses were deep. Note that the surface in Comparative Example 1 which was not subjected to surface roughening was flat. Note that the amplitude parameters (Rp, Rv, Rz, Rc, Rt, Ra, Rq, Rsk, and Rku) stipulated in ISO 4287-1997 were automatically calculated during the data analyses by the surface profile analyzer. Of these parameters, Ra and Rsk are listed in Table 1 below. FIG. 16 is a graph indicating the relationship between the surface roughness Ra and the skewness Rsk in Examples 1 to 7 and Comparative <Evaluation of Output Power and Vf>

Each of the semiconductor light-emitting elements of Examples 1 to 7 and Comparative Examples 1 to 7 was mounted on a transistor outline header (TO-18) with a silver paste, and top electrodes was bonded through gold wires. A current of 20 mA was fed to each of the semiconductor light-emitting elements of Examples 1 to 7 and Comparative Examples 1 to 7, to measure the emission output power (Po) and the forward voltage (Vf). In the measurements of an emission output power (Po), an integrating sphere was used. The forward voltage (Vf) was obtained as a voltage measured using a constant current voltage meter (Model 6243 manufactured by ADC Corporation) while the 20-mA current was fed. Measurements were carried out on 10 samples, and averages thereof are listed in Table 1.

<Evaluation of Emission Spectrum>

A current of 20 mA was fed to each of the light-emitting elements of Examples 1 to 7 and Comparative Examples 1 to 7, to obtain an emission spectrum ranging from 1000 nm to 1600 nm using a spectrometer manufactured by Otsuka Electronics Co., Ltd. (model number: MCPD-9800, light-receiving element: InGaAs, wavelength width per channel: 5.5 nm, slit width: 50 μm, and wavelength accuracy: ±2 nm) under the measurement conditions of an exposure time of 1 msec and the integration count of 60 times. The measurement results were not smoothed.

The obtained emission spectra were evaluated by the following criteria. As used herein, the term "shoulder" refers to a part of a curve in which a distinct decrease or increase of the gradient of the tangent to the curve is observable although the sign (plus or minus) of the slope of the tangent is maintained.

Emission spectra were plotted with the vertical linear axis representing emission intensities in terms of relative intensities, taking the maximum emission intensity as 1. The emission spectra were rated according to the following criteria in a wavelength range having a relative intensity of 0.1 or more. An emission spectrum was rated as C (bad) when multipeaks were observed, in other words, emission peak(s) (having a local maximum value with a gradient of zero) were observed in the emission spectrum other than the emission peak at the emission central wavelength having the maximum emission intensity.

An emission spectrum was rated as B (good) when a single peak was obtained without peaks other than the emission peak at the center wavelength, but region(s) called "shoulder(s)" were observed.

An emission spectrum was rated as A (excellent) when a single peak was obtained without regions called "shoulders".

Figure 17A:
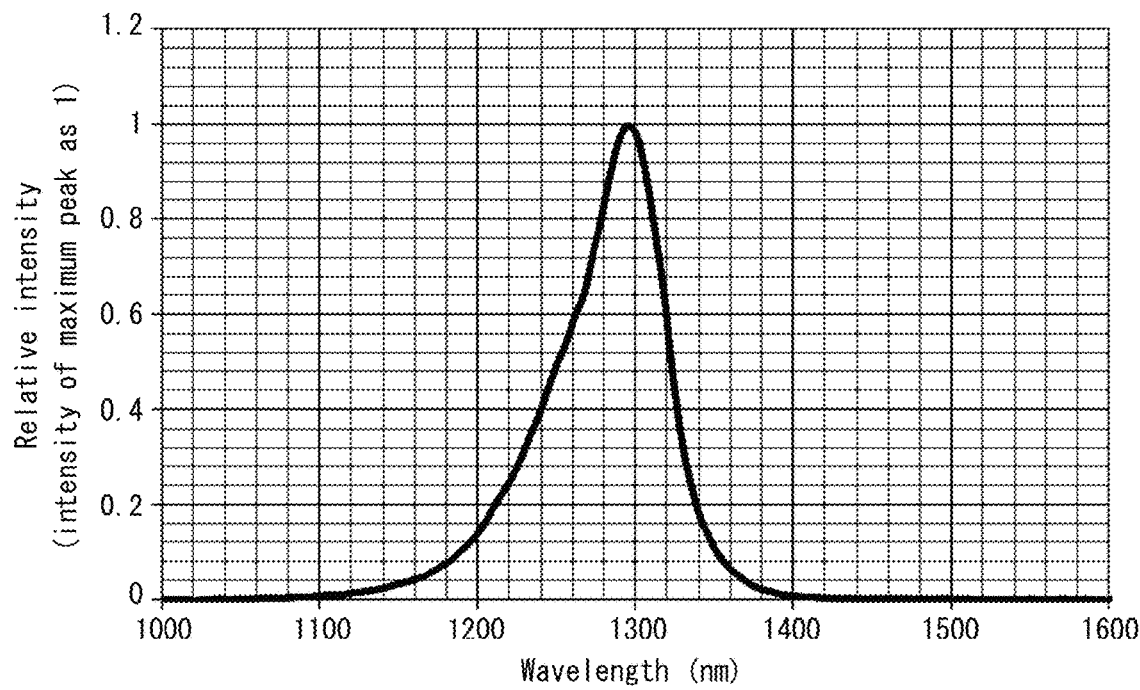
FIG. 17A is a graph indicating an emission spectrum of Example 1.
Figure 17B:
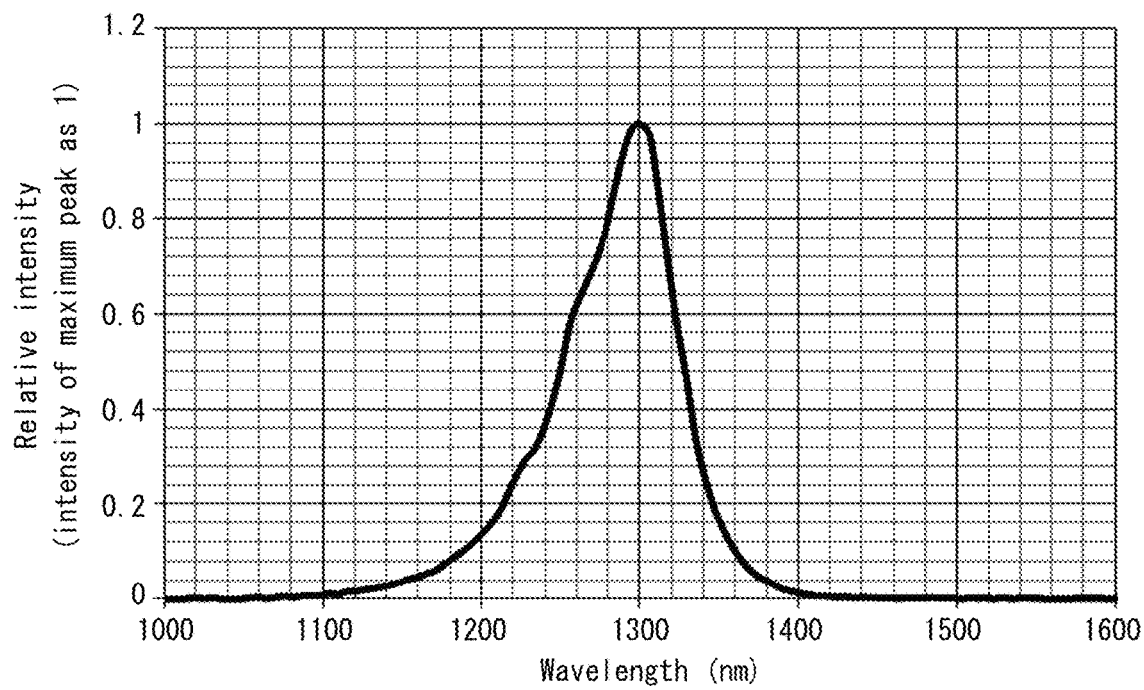
FIG. 17B is a graph indicating an emission spectrum of Example 7.
Figure 18A:
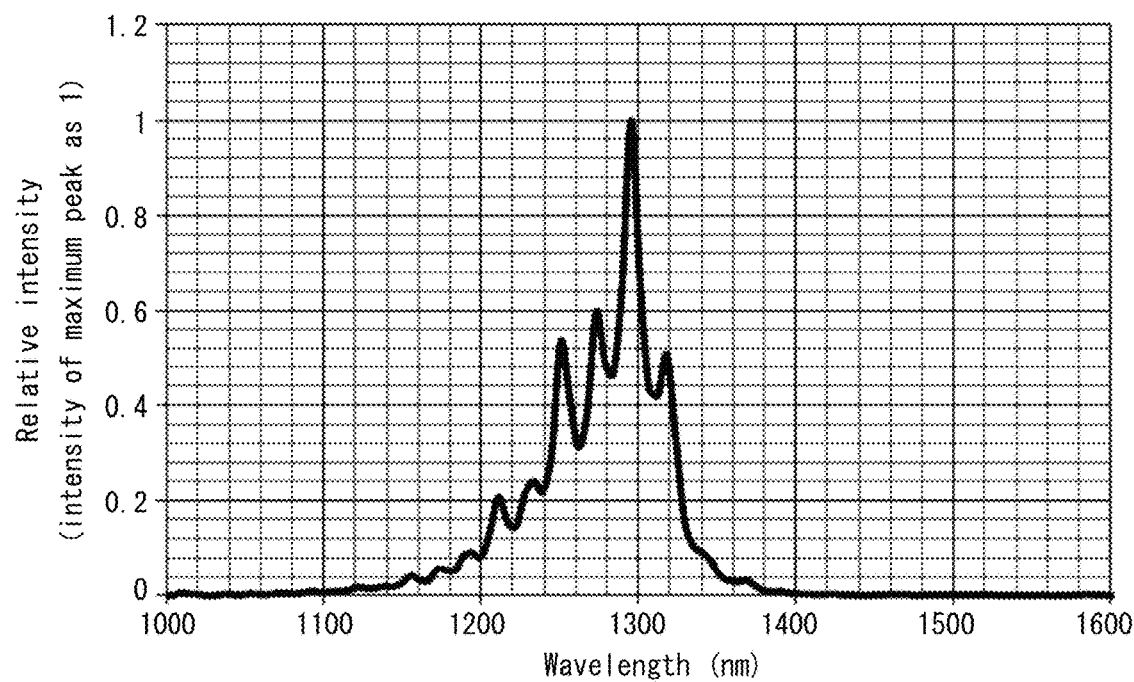
FIG. 18A is a graph indicating an emission spectrum of Comparative Example 1.
Figure 18B:
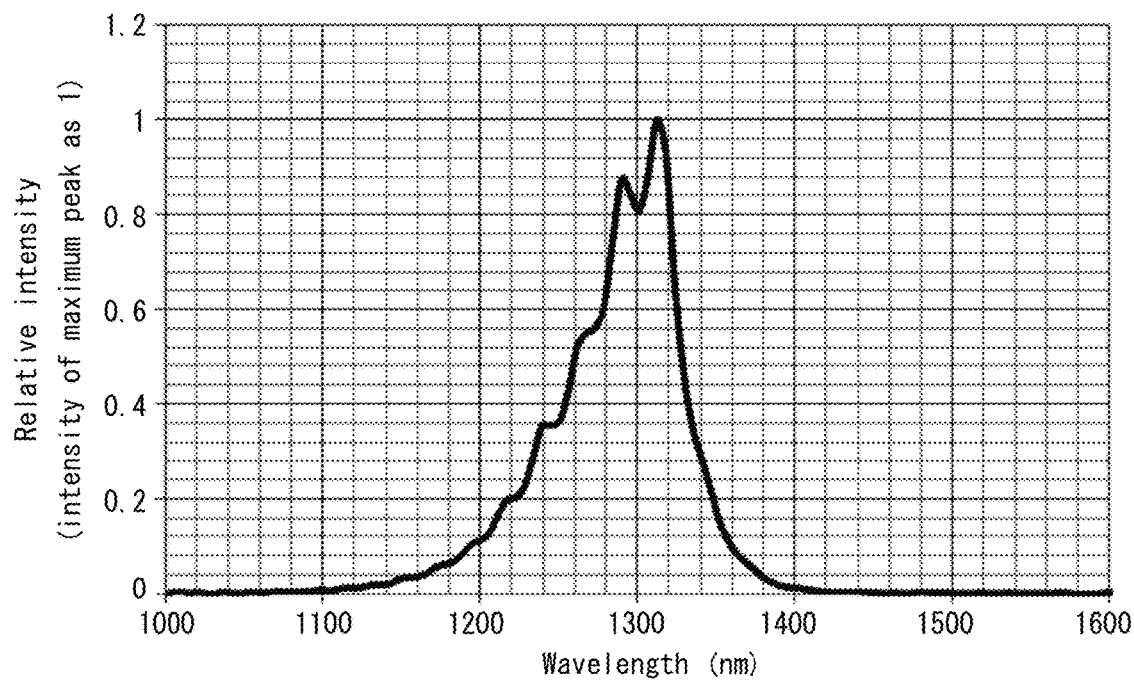
FIG. 18B is a graph indicating an emission spectrum of Comparative Example 2.

The emission spectra in Examples 1 and 7 are depicted in FIGS. 17A and 17B, respectively, as typical examples, and the emission spectra of Comparative Examples 1 to 3 are depicted in FIGS. 18A to 18C, respectively. The emission central wavelengths ($\lambda$p) were also determined. The emission central wavelengths ($\lambda$p) are listed in Table 1.

From the results of Table 1 and FIGS. 14A to 14G and 15A to 15F, it was conformed that the emission spectra each had a single peak when an irregularity profile as those in Examples 1 to 7 was provided on a light extraction face in a light-emitting element. It was also confirmed that a surface with a surface roughness Ra of an irregularity profile satisfying Ra $\geq$0.03 µm and a skewness Rsk satisfying Ra $\geq$0.03 µm and Rsk $\geq$−1 ensured a single peak. It was further confirmed that a skewness Rsk satisfying −0.5$\geq$Rsk$\geq$0.5 provided a single peak, as well as a high emission output power.

Experimental Example 2

Three-dimensional information of the roughness of each of the roughened surfaces of Examples 1, 2, 3, 5, and 7 and Comparative Examples 1 to 6 prepared in the above Experimental Example 1 was obtained as follows.

<Three Dimensional Roughness Analysis of Roughened surface>

The surface profile of a roughened surface of an n-type clad layer on a wafer after the surface roughening (before dicing) was analyzed using a profile analysis laser microscope (VK-X1000/1100 manufactured by KEYENCE Corporation). In Examples 2 and 3 and Comparative Example 3 in which a $SiO_2$ protective film was formed, the surface of the protective film after the formation of the protective film was analyzed. The lens magnification was set to 150 times, and the pixel number was set to 2048×1536.

Figure 19A:
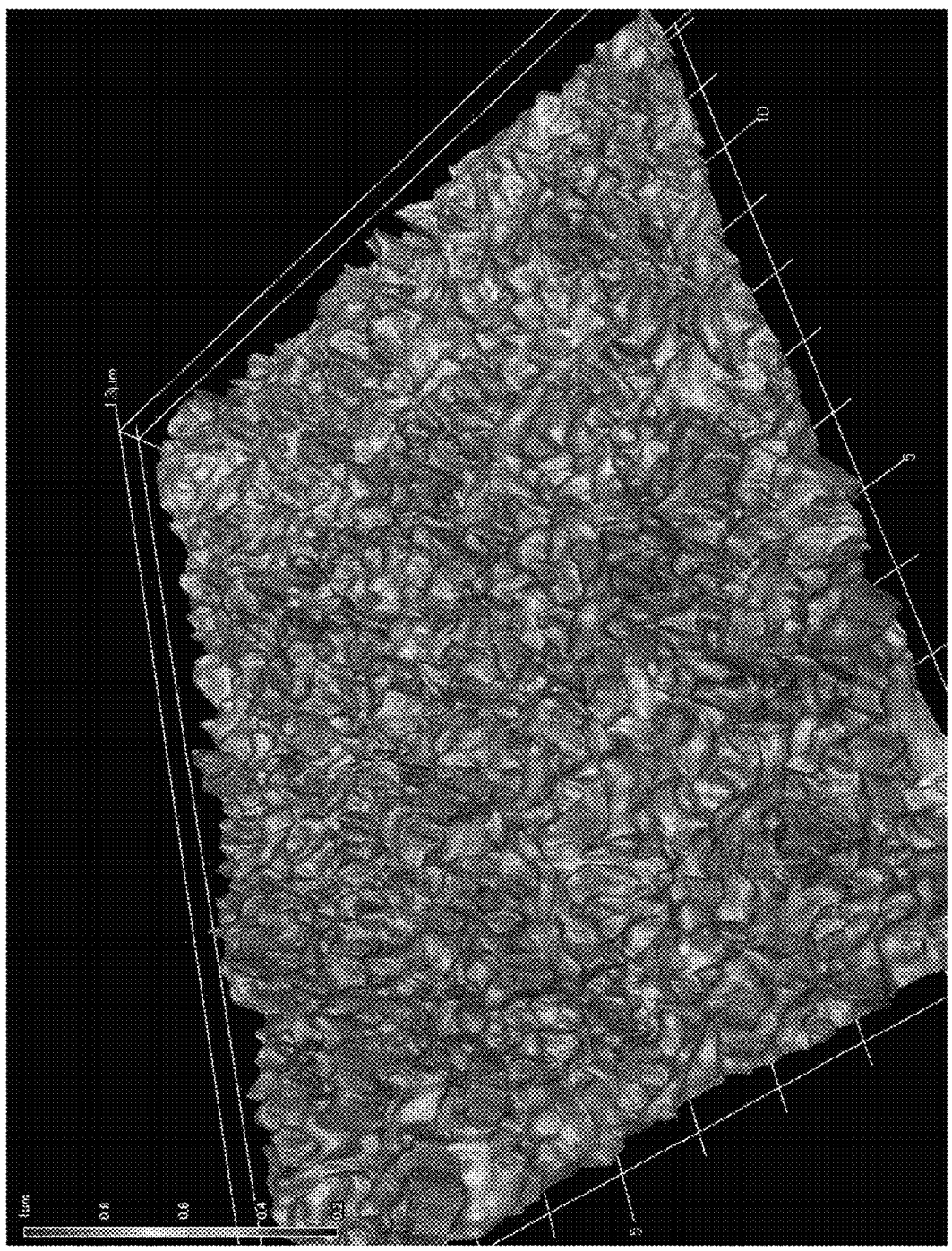
FIG. 19A is a laser microscopic image indicating a three-dimensional surface profile of the n-type cladding layer in Example 1.
Figure 19B:
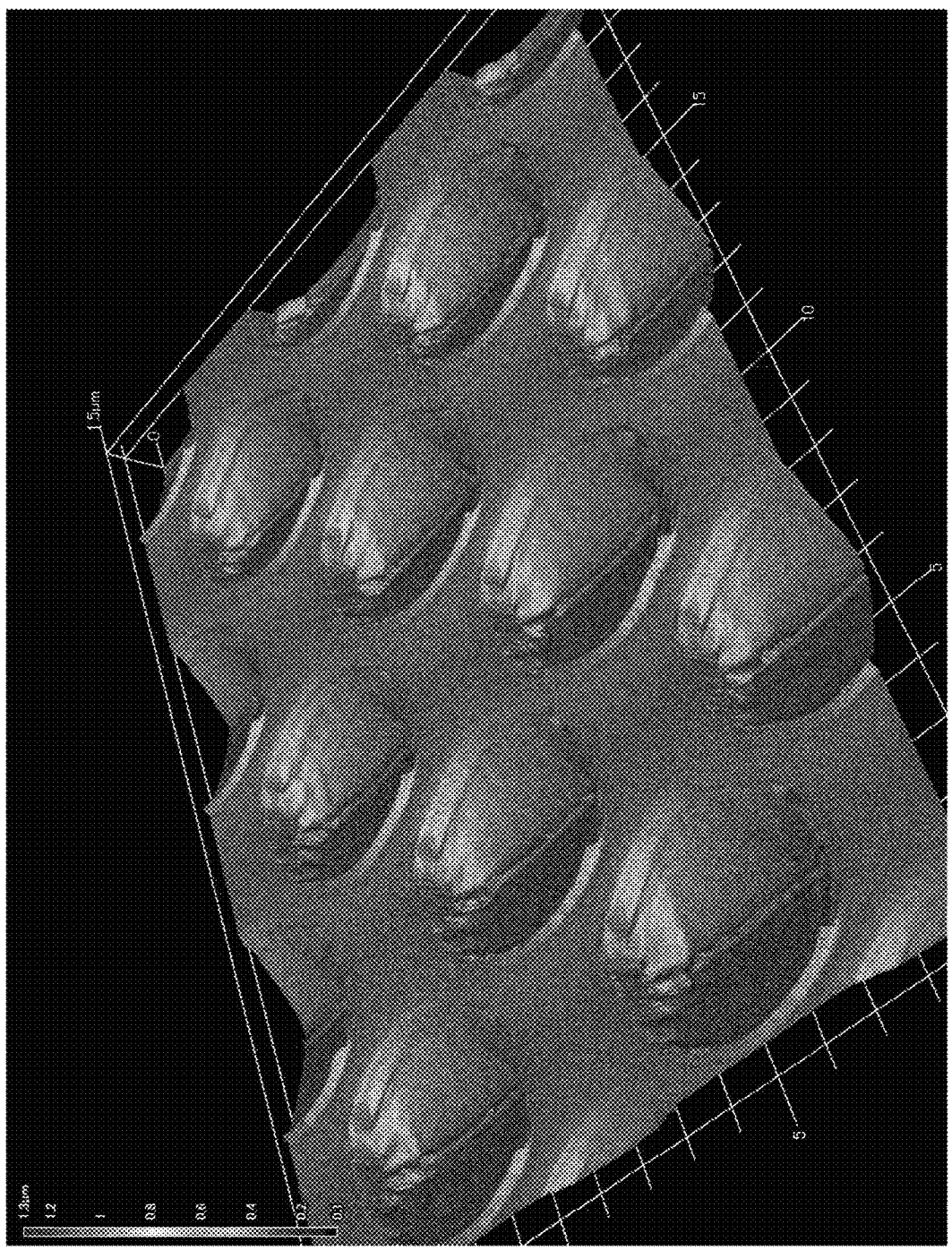
FIG. 19B is a laser microscopic image indicating a three-dimensional surface profile of the n-type cladding layer in Comparative Example 2.

The surface roughness parameters (Sa, Sz, Str, Spc, Sdr, Ssk, etc.) stipulated in ISO 25178 were automatically calculated during a data analysis. These values are listed in Table 2. As representative examples, three-dimensional images of the surfaces of the n-type cladding layers in Example 1 and Comparative Example 2 are depicted in FIGS. 19A and 19B, respectively. As can be seen in FIG. 19A, formation of a random roughened surface was observed on the surface of the n-type cladding layer in Example 1. In contrast, an array of flat pattern regions (with Ra of 0.010 µm or less) and groove regions in a certain pattern was observed on the surface of the n-type cladding layer of Comparative Example 2, indicating that it was not a random roughened surface.

TABLE 2

| | Roughness (surface of n-type InP cladding layer) | | | | | |
|---|---|---|---|---|---|---|
| | Sa (µm) | Ssk | Sz (µm) | Str | Spc (1/mm) | Sdr |
| Example 1 | 0.100 | −0.164 | 1.142 | 0.777 | 33709 | 0.589 |
| Example 5 | 0.231 | −0.283 | 1.750 | 0.718 | 45606 | 0.942 |
| Example 7 | 0.056 | −0.176 | 0.799 | 0.729 | 10667 | 0.041 |
| Comparative Example 1 | 0.007 | 0.429 | 0.087 | 0.606 | 600 | 0.000 |
| Comparative Example 2 | 0.385 | −0.630 | 1.876 | 0.752 | 17675 | 0.365 |
| Comparative Example 4 | 0.095 | −2.270 | 1.140 | 0.751 | 5630 | 0.149 |
| Comparative Example 5 | 0.330 | −1.292 | 1.835 | 0.734 | 12537 | 0.260 |
| Comparative Example 6 | 0.207 | −2.443 | 1.775 | 0.729 | 6327 | 0.127 |

| | Roughness (surface of protective film) | | | | | |
|---|---|---|---|---|---|---|
| | Sa (µm) | Ssk | Sz (µm) | Str | Spc (1/mm) | Sdr |
| Example 2 | 0.099 | −0.110 | 1.487 | 0.857 | 37463 | 0.848 |
| Example 3 | 0.173 | 0.252 | 1.594 | 0.666 | 25561 | 0.535 |
| Comparative Example 3 | 0.151 | −1.197 | 1.161 | 0.765 | 22565 | 0.385 |

Figure 20:
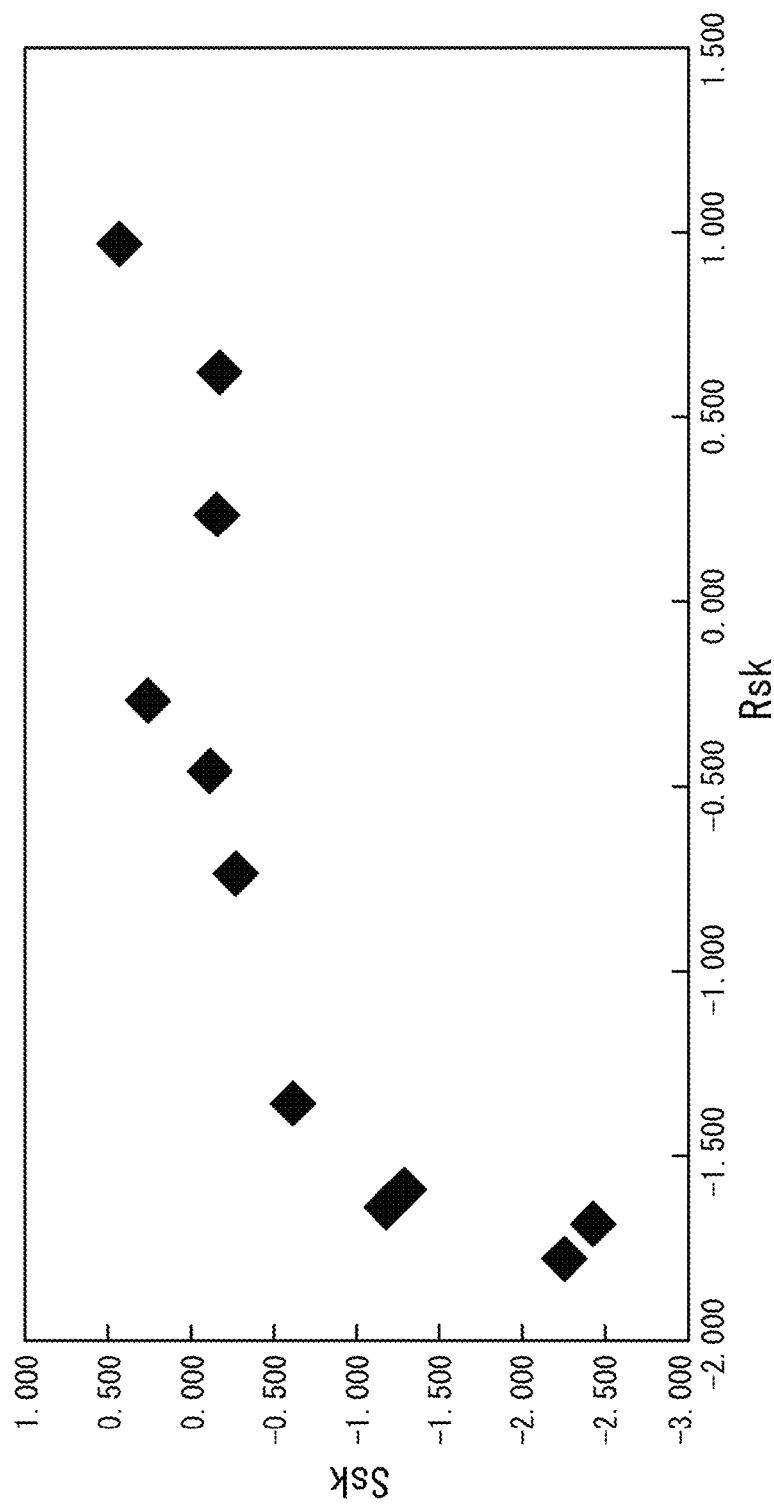
FIG. 20 is a diagram indicating the correlation between the skewness Rsk and the skewness Ssk in Experimental Example 2.

From the analysis results of the two-dimensional evaluations summarized in Table 1 and the analysis results of the three-dimensional evaluations summarized in Table 2, the correlation between the skewness Rsk and the skewness Ssk was examined, of which results were indicated in FIG. 20. From the graph in FIG. 20, it is suggested that the surface roughness Sa is preferably 0.05 µm or more and the skewness Ssk of the surface of a light extraction face is preferably −0.5 or more in a three-dimensional analysis for eliminating multipeaks. As for the values of Sdr indicating the magnitudes of developed areas (surface areas) and Po, the value of Po tended to increase as the value of Sdr increased.

Experimental Example 3

The initial emission output powers of the semiconductor light-emitting elements according to Examples 1 and 3 and Comparative Examples 1 to 3 prepared in Experimental Example 1 immediately after they were fabricated were examined using an integrating sphere. Then, the emission output powers of these semiconductor light-emitting elements were measured using the integrating sphere after a current of 100 mA was continuously fed for 1000 hours at room temperature, to thereby determine emission output maintenance ratios. The results were listed in Table 3 below. The results indicated that provision of a protective film on a random roughened surface satisfying the conditions of the present disclosure was greatly effective for suppressing a reduction in the output power caused by the continuous operation.

TABLE 3

| | Protective film | Emission output maintenance ratio | Remarks |
|---|---|---|---|
| Example 1 | Absent | 94% | Random roughened surface |
| Example 3 | Present | 99-100% | Protective film was formed on random roughened surface |
| Comparative Example 1 | Absent | 94% | Flat surface |
| Comparative Example 2 | Absent | 94% | Regular roughened surface |
| Comparative Example 3 | Present | 97% | Protective film was formed on regular roughened surface |

INDUSTRIAL APPLICABILITY

According to the present disclosure, provided are a bonding-type semiconductor light-emitting element including a cladding layer made of InGaAsP containing at least In and P, which is capable of reducing multipeaks to thereby achieve a single peak in an emission spectrum and a manufacturing method of such a semiconductor light-emitting element.

REFERENCE SIGNS LIST

1 Semiconductor light-emitting element
10 Growth substrate
20 Group III-V compound semiconductor etch stop layer
30 Semiconductor laminate
31 First conductivity type InP cladding layer
35 Semiconductor light-emitting layer
35W Well layer
35B Barrier layer
37 Second conductivity type InP cladding layer
39 Cap layer
40 Contact portion
41 (41a) Contact layer
43 Ohmic metal portion
50 Dielectric layer
60 Reflective metal layer
70 Metal bonding layer
80 Conductive support substrate
100, 100' Semiconductor light-emitting element
91 Back electrode
93 Top electrode
E1 Exposed area
E2 Exposed surface
E3 Exposed portion

The invention claimed is:

1. A semiconductor light-emitting element comprising, in this order:
   a substrate;
   a reflective layer;
   a first conductivity type cladding layer made of InGaAsP containing at least In and P;
   a semiconductor light-emitting layer having an emission central wavelength of 1000 nm to 2200 nm; and
   a second conductivity type cladding layer made of InGaAsP containing at least In and P, the second conductivity type cladding layer being configured to be on a light extraction side,
   a surface of a light extraction face of the second conductivity type cladding layer being a roughened surface which has a surface roughness Ra of 0.03 μm or more and has a random irregularity pattern,
   wherein the surface of the light extraction face has a skewness Rsk of −1 or more, and a protective film is provided on the light extraction face and an emission spectrum of the semiconductor light-emitting element has a single peak.

2. The semiconductor light-emitting element according to claim 1, wherein the protective film has a thickness of 100 nm or more and 700 nm or less, and a surface of the protective film has a surface roughness Ra of 0.02 μm or more and a skewness Rsk of −1 or more.

3. The semiconductor light-emitting element of claim 1, wherein the protective film contains at least one selected from the group consisting of silicon oxide, silicon nitride, ITO, and AlN.

4. A semiconductor light-emitting element comprising, in this order:
   a support substrate;
   a metal bonding layer
   a reflective layer;
   a first conductivity type cladding layer made of InGaAsP containing at least In and P;
   a semiconductor light-emitting layer having an emission central wavelength of 1000 nm to 2200 nm; and
   a second conductivity type cladding layer made of InGaAsP containing at least In and P, the second conductivity type cladding layer being configured to be on a light extraction side,
   a surface of a light extraction face of the second conductivity type cladding layer being a roughened surface which has a surface roughness Ra of 0.03 μm or more and has a random irregularity pattern,
   wherein the surface of the light extraction face has a skewness Rsk of −1 or more, and a protective film is provided on the light extraction face and an emission spectrum of the semiconductor light-emitting element has a single peak.

5. The semiconductor light-emitting element according to claim 4, wherein the protective film has a thickness of 100 nm or more and 700 nm or less, and a surface of the protective film has a surface roughness Ra of 0.02 μm or more and a skewness Rsk of −1 or more.

6. The semiconductor light-emitting element of claim 4, wherein the protective film contains at least one selected from the group consisting of silicon oxide, silicon nitride, ITO, and AlN.

7. A semiconductor light-emitting element comprising, in this order:
   a substrate;
   a reflective layer;
   a first conductivity type cladding layer made of InGaAsP containing at least In and P;
   a semiconductor light-emitting layer having an emission central wavelength of 1000 nm to 2200 nm; and a second conductivity type cladding layer made of InGaAsP containing at least In and P, the second conductivity type cladding layer being configured to be on a light extraction side, wherein a protective film is provided on a surface of a light extraction face of the second conductivity type cladding layer, and the protective film has a thickness of 100 nm or more and 700 nm or less, and a surface of the protective film has a surface roughness Ra of 0.02 µm or more and a skewness Rsk of −1 or more and an emission spectrum of the semiconductor light-emitting element has a single peak.

8. The semiconductor light-emitting element of claim 7, wherein the protective film contains at least one selected from the group consisting of silicon oxide, silicon nitride, ITO, and AlN.

9. A semiconductor light-emitting element comprising, in this order:

a support substrate;

a metal bonding layer a reflective layer;

a first conductivity type cladding layer made of InGaAsP containing at least In and P;

a semiconductor light-emitting layer having an emission central wavelength of 1000 nm to 2200 nm; and a second conductivity type cladding layer made of InGaAsP containing at least In and P, the second conductivity type cladding layer being configured to be on a light extraction side, wherein a protective film is provided on a surface of a light extraction face of the second conductivity type cladding layer, and the protective film has a thickness of 100 nm or more and 700 nm or less, and a surface of the protective film has a surface roughness Ra of 0.02 µm or more and a skewness Rsk of −1 or more and an emission spectrum of the semiconductor light-emitting element has a single peak.

10. The semiconductor light-emitting element of claim 9, wherein the protective film contains at least one selected from the group consisting of silicon oxide, silicon nitride, ITO, and AlN.

* * * * *